US011285517B2

(12) United States Patent
Tanaka

(10) Patent No.: US 11,285,517 B2
(45) Date of Patent: Mar. 29, 2022

(54) SUBSTRATE CLEANING APPARATUS, SUBSTRATE CLEANING METHOD, AND SUBSTRATE PROCESSING APPARATUS

(71) Applicant: EBARA CORPORATION, Tokyo (JP)

(72) Inventor: Hideaki Tanaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 26 days.

(21) Appl. No.: 16/739,511

(22) Filed: Jan. 10, 2020

(65) Prior Publication Data

US 2020/0147654 A1 May 14, 2020

Related U.S. Application Data

(62) Division of application No. 15/045,045, filed on Feb. 16, 2016, now Pat. No. 10,562,076.

(30) Foreign Application Priority Data

Feb. 18, 2015 (JP) .............................. JP2015-029666
Mar. 9, 2015 (JP) .............................. JP2015-046292

(51) Int. Cl.
*H01L 21/67* (2006.01)
*B08B 1/00* (2006.01)
*B08B 1/04* (2006.01)
*B24B 37/11* (2012.01)

(52) U.S. Cl.
CPC .............. *B08B 1/001* (2013.01); *B08B 1/007* (2013.01); *B08B 1/04* (2013.01); *B24B 37/11* (2013.01); *H01L 21/67046* (2013.01)

(58) Field of Classification Search
None
See application file for complete search history.

(56) References Cited

U.S. PATENT DOCUMENTS 5,167,755 A 12/1992 Zodrow et al.
5,745,945 A 5/1998 Manfredi et al.
(Continued)

FOREIGN PATENT DOCUMENTS

CN 104334290 A 2/2015
JP S63-239953 A 10/1988
(Continued)

OTHER PUBLICATIONS

English machine translation of JP 2000150441 A.*
Singapore Patent Application No. 10201601095U; Search Report; dated Apr. 26, 2018; 4 pages.

*Primary Examiner* — Cristi J Tate-Sims
(74) *Attorney, Agent, or Firm* — BakerHostetler

(57) ABSTRACT

A substrate cleaning apparatus for cleaning a substrate while rotating the substrate and placing a cleaning member in contact with the rotating substrate is disclosed. The substrate cleaning apparatus comprises: a self-cleaning member mounted to an arm supporting the cleaning member, the self-cleaning member being configured to come into contact with the cleaning member to perform self-cleaning of the cleaning member; and a moving mechanism mounted to the arm supporting the cleaning member, the moving mechanism being configured to move the self-cleaning member between a position where the self-cleaning member is in contact with the cleaning member and a position where the self-cleaning member is separated from the cleaning member.

10 Claims, 14 Drawing Sheets

(56) References Cited

U.S. PATENT DOCUMENTS

| | | | |
|---|---|---|---|
| 5,860,181 A | 1/1999 | Maekawa et al. | |
| 6,167,583 B1 * | 1/2001 | Miyashita | H01L 21/67028 15/77 |
| 6,579,797 B1 | 6/2003 | Crevasse et al. | |
| 7,010,826 B2 * | 3/2006 | Hirose | B08B 1/04 15/102 |
| 2010/0212702 A1 | 8/2010 | Hamada | |
| 2010/0325913 A1 * | 12/2010 | Wang | F26B 5/12 34/423 |
| 2014/0331440 A1 * | 11/2014 | Ishibashi | H01L 21/67046 15/302 |
| 2015/0144164 A1 * | 5/2015 | Ishibashi | H01L 21/68792 134/98.1 |

FOREIGN PATENT DOCUMENTS

| | | |
|---|---|---|
| JP | 09-092633 A | 4/1997 |
| JP | H10-289889 A | 10/1998 |
| JP | 10-323631 A | 12/1998 |
| JP | H10-321572 A | 12/1998 |
| JP | 2000-150441 A | 5/2000 |
| JP | 2000150441 A * | 5/2000 |
| JP | 2001-054765 A | 2/2001 |
| JP | 2001-121096 A | 5/2001 |
| JP | 2002-096037 A | 4/2002 |
| JP | 2008-541413 A | 11/2008 |
| JP | 2008-311481 A | 12/2008 |
| JP | 2012-119722 A | 6/2012 |
| JP | 2014-203906 A | 10/2014 |
| JP | 2014-216456 A | 11/2014 |
| WO | WO 2007/032414 A1 | 3/2007 |

\* cited by examiner

SUBSTRATE CLEANING APPARATUS, SUBSTRATE CLEANING METHOD, AND SUBSTRATE PROCESSING APPARATUS

CROSS REFERENCE TO RELATED APPLICATION

This application is a divisional of U.S. patent application Ser. No. 15/045,045, filed Feb. 16, 2016 and claims priority to Japanese Patent Application No. 2015-029666 filed Feb. 18, 2015 and Japanese Patent Application No. 2015-046292 filed Mar. 9, 2015, the entire contents of which are hereby incorporated by reference.

BACKGROUND

Scrub cleaning, which has the advantage of being capable of efficiently cleaning off particles such as polishing debris and abrasive particles contained in a polishing liquid, is widely employed these days in a cleaning apparatus of a semiconductor manufacturing apparatus, especially a chemical mechanical polishing (CMP) apparatus. In particular, scrub cleaning of a substrate with a roll cleaning tool is widely employed because of the advantages of not damaging the substrate, being capable of absorbing dirt such as a polishing liquid, having a high scraping effect, etc.

Cleaning of a substrate using a roll cleaning tool is performed by rubbing the roll cleaning tool against the substrate while rotating the substrate and supplying a cleaning liquid (e.g. a liquid chemical or pure water) to the substrate. By rubbing the roll cleaning tool against the surface of the substrate in the presence of the cleaning liquid, particles, such as polishing debris and abrasive particles contained in a polishing liquid, are removed from the surface of the substrate. The particles that have been removed from the substrate are absorbed or accumulated in the roll cleaning tool, or are discharged from the substrate together with the cleaning liquid.

However, some particles, once accumulated in the roll cleaning tool, can come off the roll cleaning tool and may be attached to the substrate surface again during scrub cleaning of the substrate, thus possibly causing so-called back contamination. Further, some particles, which have been once removed from the substrate surface by the roll cleaning tool, can be attached to the substrate surface again before the particles are discharged from the substrate along with the cleaning liquid.

For cleaning of a front surface of a substrate, a PVA (polyvinyl alcohol) sponge may be used in order to remove fine particles. When a substrate is held on a top ring which is a substrate holder, the substrate is brought into contact with a membrane and dirt may adhere to a back surface of the substrate due to a bonding force of the dirt acting on the substrate. In view of this, cleaning of the back surface of the substrate may be performed with use of a sponge of non-woven fabric comprising fibers bound by resin and having fine surface pores formed between fibers.

In the scrub cleaning with use of the cleaning member such as a roll sponge, the cleaning member is placed in direct contact with the substrate. Therefore, contamination of the cleaning member itself is a factor that influences the cleaning effect. As the contamination of the cleaning member progresses, a contaminant accumulated on the cleaning member can contaminate the substrate, while a contaminant is removed from the substrate. As a result, the cleaning effect cannot be obtained. Such a phenomenon is called back contamination. Such back contamination should be prevented as much as possible. Therefore, attempts are currently being made to prevent the back contamination.

A so-called self-cleaning method, which involves cleaning a cleaning member itself without replacing it even when it is contaminated, is used as a means for preventing the back contamination.

There are two main self-cleaning methods currently used.

The first method is a method called inner rinsing, which involves passing a cleaning liquid from an interior to an exterior of a roll sponge, thereby cleaning the roll sponge. This method, which cleans off dirt with the cleaning liquid in a simple manner, has the advantages of being capable of arbitrarily carrying out cleaning regardless of the structure of the roll cleaning machine used and the position of the roll, and not causing any unwanted damage to the sponge.

The second method is a method using a roll cleaning machine in which a roll sponge is configured to be retreated from a position on a substrate to a standby position, and involves providing a cleaning plate at the roll sponge standby position in order to clean the roll sponge during standby by rubbing the roll sponge against the cleaning plate.

Of the above-described two self-cleaning methods, the inner rinsing method, which involves passing the cleaning liquid from the interior to the exterior of a roll sponge so as to clean the roll sponge, has the drawback of low effect of cleaning off dirt clogging pores of the roll sponge, i.e. low cleaning effect.

The other method, which cleans the roll sponge in the standby position by rubbing the roll sponge against the cleaning plate, has the drawback that cleaning of the roll sponge can be carried out only when the roll sponge is in the standby position. Furthermore, the roll sponge is forced to keep pressing on the cleaning plate during the period when the roll sponge stays in the standby position, and the self-cleaning operation cannot be arbitrarily stopped during standby of the roll sponge. Thus, this method has the drawback of being incapable of arbitrarily controlling a self-cleaning time. This may cause early wear of the roll sponge if a set time of the standby is long.

SUMMARY OF THE INVENTION

There is provided a substrate cleaning apparatus and method which can perform self-cleaning of a cleaning member, such as a roll sponge, at any arbitrary timing regardless of a position and a state of the cleaning member, can keep the cleaning member clean, and can expect a longer life of the cleaning member.

There are provided a substrate cleaning apparatus and substrate cleaning method which can prevent back contamination of a substrate. Further, there is provided a substrate processing apparatus incorporating such a substrate cleaning apparatus.

Embodiments, which will be described below, relate to a substrate cleaning apparatus for cleaning a substrate, such as a semiconductor wafer, and more particularly to a substrate cleaning apparatus and substrate cleaning method having a self-cleaning function to self-clean a cleaning member which makes contact with a substrate to clean the substrate.

Below-described embodiments also relate to a substrate cleaning apparatus and substrate cleaning method for scrub-cleaning a substrate, such as a wafer, with a roll cleaning tool while supplying a cleaning liquid (e.g. a liquid chemical or pure water) to the substrate. Further, below-described embodiments relate to a substrate processing apparatus provided with such a substrate cleaning apparatus.

In an embodiment, there is provided a substrate cleaning apparatus for cleaning a substrate while rotating the substrate and placing a cleaning member in contact with the rotating substrate, comprising: a self-cleaning member mounted to an arm supporting the cleaning member, the self-cleaning member being configured to come into contact with the cleaning member to perform self-cleaning of the cleaning member; and a moving mechanism mounted to the arm supporting the cleaning member, the moving mechanism being configured to move the self-cleaning member between a position where the self-cleaning member is in contact with the cleaning member and a position where the self-cleaning member is separated from the cleaning member.

The self-cleaning member and the moving mechanism for moving the self-cleaning member are attached to the arm supporting the cleaning member. This structure makes it possible to perform, during cleaning of a substrate, self-cleaning of the cleaning member by actuating the moving mechanism and bringing the self-cleaning member into contact with the cleaning member. Further, self-cleaning of the cleaning member can be performed by actuating the moving mechanism and bringing the self-cleaning member into contact with the cleaning member at any arbitrary timing regardless of the position (cleaning position or standby position) and the state (during cleaning of a substrate or during standby) of the cleaning member.

In an embodiment, the cleaning member comprises a roll sponge.

The use of the roll sponge in cleaning of the substrate has the advantages of not damaging the substrate, being capable of absorbing dirt such as a polishing liquid, and being capable of cleaning the substrate with a high dirt scraping effect.

In an embodiment, the self-cleaning member is mounted to the arm via a mounting member.

The self-cleaning member is mounted to the arm via the mounting member, and the moving mechanism is mounted to the arm either directly or via a mounting member or the like.

In an embodiment, the self-cleaning member is mounted to the moving mechanism which is mounted to the arm.

The self-cleaning member is mounted to the moving mechanism, and the moving mechanism is mounted to the arm either directly or via a mounting member or the like.

In an embodiment, the self-cleaning member comprises a cleaning plate.

The cleaning plate serving as the self-cleaning member may have a flat smooth surface.

In an embodiment, the moving mechanism comprises a linear moving mechanism or a rotational moving mechanism.

The moving mechanism is a linear moving mechanism such as an air cylinder or an electric cylinder, or a rotational moving mechanism such as a rotary actuator.

In an embodiment, the moving mechanism is housed in a waterproof housing having a hole that allows movement of a moving portion of the moving mechanism.

In an embodiment, a bellows is provided so as to surround the hole of the housing and the moving portion of the moving mechanism.

The moving mechanism is housed in the waterproof housing and the moving portion of the moving mechanism is surrounded by the bellows. This can prevent a cleaning liquid (liquid chemical) from attaching to the moving mechanism and the moving portion of the moving mechanism, thereby preventing an operational failure of the moving mechanism due to the attachment of the cleaning liquid thereto.

In an embodiment, the substrate cleaning apparatus further comprises a nozzle mounted to the arm supporting the cleaning member and configured to supply a cleaning liquid to an area of contact between the cleaning member and the self-cleaning member.

A cleaning liquid as a self-cleaning liquid can be supplied during self-cleaning of the cleaning member. This can enhance the self-cleaning effect. Pure water or a liquid chemical can be used as the cleaning liquid.

In an embodiment, there is provided a substrate processing apparatus comprising: a substrate processing section for performing predetermined processing of a substrate; and a substrate cleaning apparatus for cleaning the substrate which has undergone the predetermined processing in the substrate processing section, wherein the substrate cleaning apparatus is the above-described substrate cleaning apparatus.

In an embodiment, the substrate processing section is a polishing section for polishing the substrate.

In an embodiment, there is provided a substrate cleaning method comprising: cleaning a substrate while rotating the substrate and placing a cleaning member in contact with the rotating substrate; and self-cleaning the cleaning member by bringing a self-cleaning member into contact with the cleaning member while cleaning the substrate.

In an embodiment, the substrate cleaning method further comprises: moving the cleaning member away from the substrate and moving the cleaning member to a standby position after cleaning of the substrate; and self-cleaning the cleaning member by bringing the self-cleaning member into contact with the cleaning member on standby in the standby position.

In an embodiment, a cleaning liquid can be supplied to an area of contact between the cleaning member and the self-cleaning member during said self-cleaning of the cleaning member.

In an embodiment, there is provided a substrate holding mechanism configured to hold and rotate a substrate; a cleaning-liquid supply nozzle configured to supply a cleaning liquid onto the substrate held by the substrate holding mechanism; a roll cleaning tool configured to clean the substrate by rubbing the substrate in the presence of the cleaning liquid; and a suction system coupled to the roll cleaning tool and configured to suck the cleaning liquid from the substrate through the roll cleaning tool.

In an embodiment, the suction system includes: a cleaning liquid suction pipe coupled to the roll cleaning tool; a vacuum line coupled to the cleaning liquid suction pipe; and a suction valve attached to the cleaning liquid suction pipe.

In an embodiment, the substrate cleaning apparatus further comprises a controller configured to control operation of the suction valve, the controller being configured to keep the suction valve open during cleaning of the substrate with the roll cleaning tool.

In an embodiment, the roll cleaning tool includes a shaft and a sponge member that covers a peripheral surface of the shaft. The shaft has a main flow passage extending in the shaft, a plurality of openings formed in the peripheral surface of the shaft, and a plurality of branch flow passages providing fluid communication between the main flow passage and the plurality of openings. The cleaning liquid suction pipe is coupled to the main flow passage.

In an embodiment, the substrate cleaning apparatus further comprises an inner rinsing liquid supply line coupled to the cleaning liquid suction pipe, a connection point between the cleaning liquid suction pipe and the inner rinsing liquid supply line being located between the suction valve and the roll cleaning tool.

In an embodiment, there is provided a substrate cleaning method comprising: supplying a cleaning liquid onto a substrate and rubbing a roll cleaning tool against the substrate in the presence of the cleaning liquid, while sucking the cleaning liquid from the substrate through the roll cleaning tool.

In an embodiment, there is provided a substrate processing apparatus comprising: a polishing unit configured to polish a substrate; and a substrate cleaning apparatus configured to clean the substrate that has been polished by the polishing unit, wherein the substrate cleaning apparatus includes: a substrate holding mechanism configured to hold and rotate the substrate; a cleaning-liquid supply nozzle configured to supply a cleaning liquid onto the substrate held by the substrate holding mechanism; a roll cleaning tool configured to clean the substrate by rubbing the substrate in the presence of the cleaning liquid; and a suction system coupled to the roll cleaning tool and configured to suck the cleaning liquid from the substrate through the roll cleaning tool.

According to the above-described embodiments, particles, such as polishing debris and abrasive particles which have been scraped from a surface of a substrate by the roll cleaning tool, are immediately sucked and removed, together with the cleaning liquid, from the substrate through the roll cleaning tool. Because a suction force is generated in the roll cleaning tool during cleaning of the substrate, particles that have accumulated in the roll cleaning tool are unlikely to leave the roll cleaning tool. Further, particles that have been once removed from the substrate are sucked into the roll cleaning tool together with the cleaning liquid before the particles are re-attached to the surface of the substrate. Therefore, back contamination of the substrate can be prevented.

DESCRIPTION OF THE EMBODIMENTS

Embodiments will be described with reference to the drawings.

Figure 1:
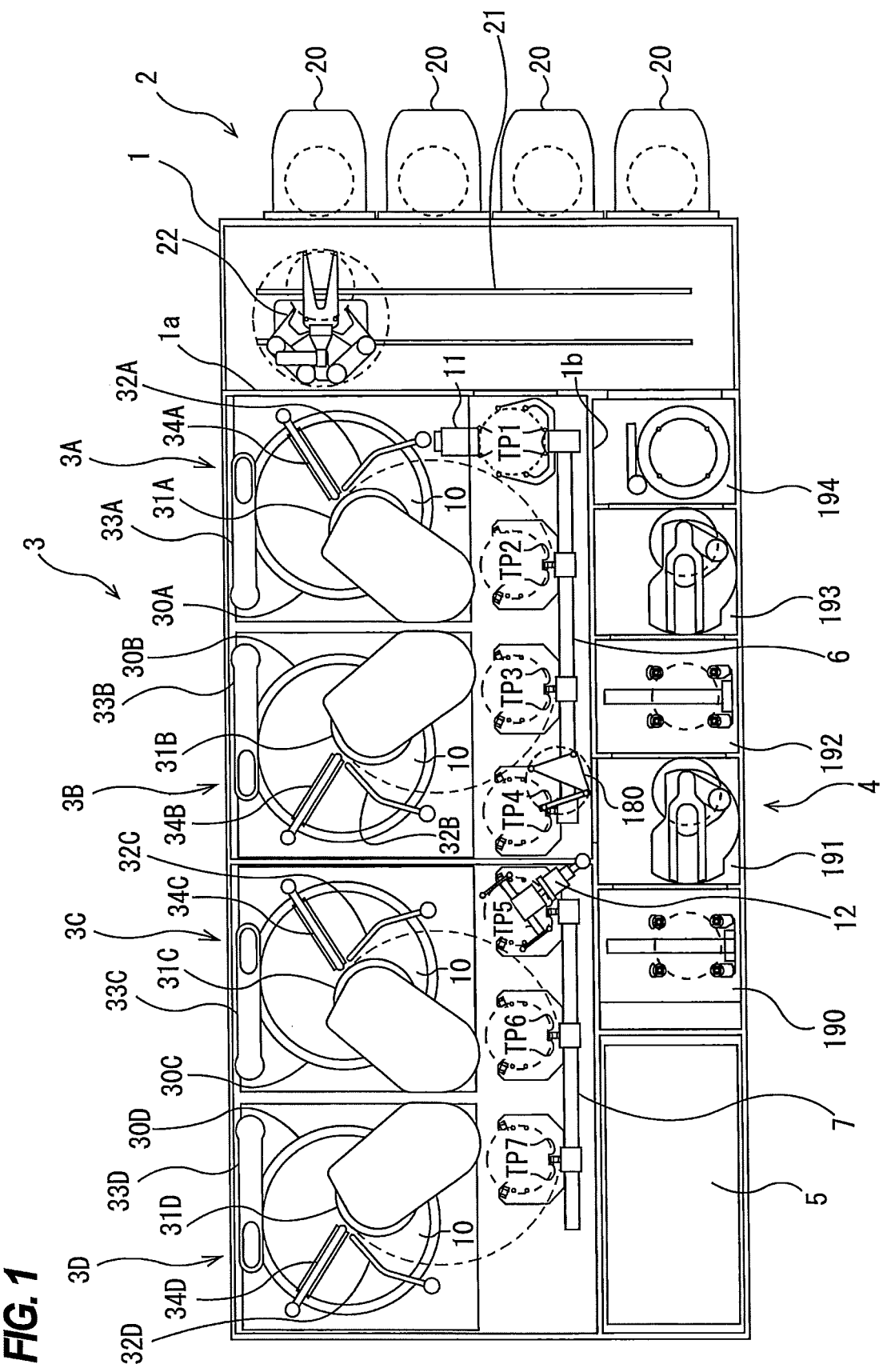
FIG. 1 is a plan view showing an overall construction of a substrate processing apparatus including a substrate cleaning apparatus according to an embodiment.

FIG. 1 is a plan view showing a whole arrangement of a substrate processing apparatus including a substrate cleaning apparatus according to an embodiment. As shown in FIG. 1, the substrate processing apparatus has a housing 1 in substantially a rectangular form. An interior of the housing 1 is divided by partition walls 1a and 1b into a loading-and-unloading section 2, a polishing section 3, and a cleaning section 4. The loading-and-unloading section 2, the polishing section 3, and the cleaning section 4 are assembled independently of each other, and air is discharged from these sections independently. The substrate processing apparatus further includes a controller 5 for controlling substrate processing operations.

The loading-and-unloading section 2 has two or more (four in this embodiment) front loading units 20 on which wafer cassettes, each storing plural wafers (substrates), are placed. The front loading units 20 are arranged adjacent to the housing 1 along a width direction of the substrate processing apparatus (a direction perpendicular to a longitudinal direction of the substrate processing apparatus). Each of the front loading units 20 is capable of receiving thereon an open cassette, an SMIF (Standard Manufacturing Interface) pod, or a FOUP (Front Opening Unified Pod). The SMIF and FOUP are a hermetically sealed container which can house a wafer cassette therein and is covered with a partition wall to thereby provide interior environments isolated from an external space.

The loading-and-unloading section 2 has a moving mechanism 21 extending along an arrangement direction of the front loading units 20. A transfer robot (or a loader) 22 is installed on the moving mechanism 21 and is movable along the arrangement direction of the wafer cassettes. The transfer robot 22 is configured to move on the moving mechanism 21 so as to access the wafer cassettes mounted on the front loading units 20. The transfer robot 22 has vertically arranged two hands, which are separately used. The upper hand can be used for returning a processed wafer to the wafer cassette, and the lower hand can be used for taking out a wafer, to be processed, from the wafer cassette. The lower hand of the transfer robot 22 is configured to be able to rotate about its own axis, so that the wafer can be reversed.

The loading-and-unloading section 2 is required to be a cleanest area. Therefore, pressure in the interior of the loading-and-unloading section 2 is kept higher at all times than pressures in the exterior space of the substrate processing apparatus, the polishing section 3, and the cleaning section 4. The polishing section 3 is the dirtiest area, because slurry is used as a polishing liquid. Therefore, negative pressure is produced in the polishing section 3, and the pressure in polishing section 3 is kept lower than the internal pressure of the cleaning section 4. A filter fan unit (not shown) having a clean air filter, such as HEPA filter, ULPA filter or a chemical filter, is provided in the loading-and-unloading section 2. This filter fan unit removes particles, toxic vapor, and toxic gas from air to form flow of clean air at all times.

The polishing section 3 is an area where a surface of a wafer is polished (or planarized). This polishing section 3 includes a first polishing unit 3A, a second polishing unit 3B, a third polishing unit 3C, and a fourth polishing unit 3D. The first polishing unit 3A, the second polishing unit 3B, the third polishing unit 3C, and the fourth polishing unit 3D are arranged along the longitudinal direction of the substrate processing apparatus as shown in FIG. 1.

As shown in FIG. 1, the first polishing unit 3A includes a polishing table 30A to which a polishing pad 10 having a polishing surface is attached, a top ring 31A for holding a wafer and pressing the wafer against the polishing pad 10 on the polishing table 30A to polish the wafer, a polishing liquid supply nozzle 32A for supplying a polishing liquid and a dressing liquid (e.g., pure water) onto the polishing pad 10, a dresser 33A for dressing the polishing surface of the polishing pad 10, and an atomizer 34A for ejecting a mixture of a liquid (e.g., pure water) and a gas (e.g., nitrogen gas) or a liquid (e.g., pure water) in an atomized state onto the polishing surface of the polishing pad 10.

Similarly, the second polishing unit 3B includes a polishing table 30B to which a polishing pad 10 is attached, a top ring 31B, a polishing liquid supply nozzle 32B, a dresser 33B, and an atomizer 34B. The third polishing unit 3C includes a polishing table 30C to which a polishing pad 10 is attached, a top ring 31C, a polishing liquid supply nozzle 32C, a dresser 33C, and an atomizer 34C. The fourth polishing unit 3D includes a polishing table 30D to which a polishing pad 10 is attached, a top ring 31D, a polishing liquid supply nozzle 32D, a dresser 33D, and an atomizer 34D.

As shown in FIG. 1, the cleaning section 4 includes a first cleaning chamber 190, a first transfer chamber 191, a second cleaning chamber 192, a second transfer chamber 193, and a drying chamber 194. In the first cleaning chamber 190, an upper primary cleaning unit and a lower primary cleaning unit are disposed. These primary cleaning units are arranged along the vertical direction. Similarly, an upper secondary cleaning unit and a lower secondary cleaning unit are disposed in the second cleaning chamber 192, and are arranged along the vertical direction. In the drying chamber 194, an upper drying unit and a lower drying unit are disposed along the vertical direction. A vertically-movable first transfer robot is provided in the first transfer chamber 191, and a vertically-movable second transfer robot is provided in the second transfer chamber 193.

As described above, the cleaning section 4 has the two primary cleaning units and the two secondary cleaning units, which can provide plural cleaning lines for cleaning plural wafers in parallel. The term "cleaning line" is a route of a wafer in the cleaning section 4 when cleaned by the plural cleaning units. For example, plural (typically two) wafers can be cleaned and dried substantially simultaneously by the two parallel cleaning lines.

The primary cleaning unit and/or the secondary cleaning unit is constituted by a substrate cleaning apparatus configured to clean a wafer by scrubbing both a front surface and a back surface of the wafer with roll cleaning tools in the presence of a cleaning liquid. The drying unit is constituted by a spin drying apparatus configured to hold a wafer, eject IPA vapor from a moving nozzle to dry the wafer, and rotate the wafer at a high speed to further dry the substrate.

The wafer is polished by at least one of the polishing units 3A to 3D. The polished wafer is cleaned by the primary cleaning unit and the secondary cleaning unit, and the cleaned substrate is then dried by the drying unit.

Figure 2:
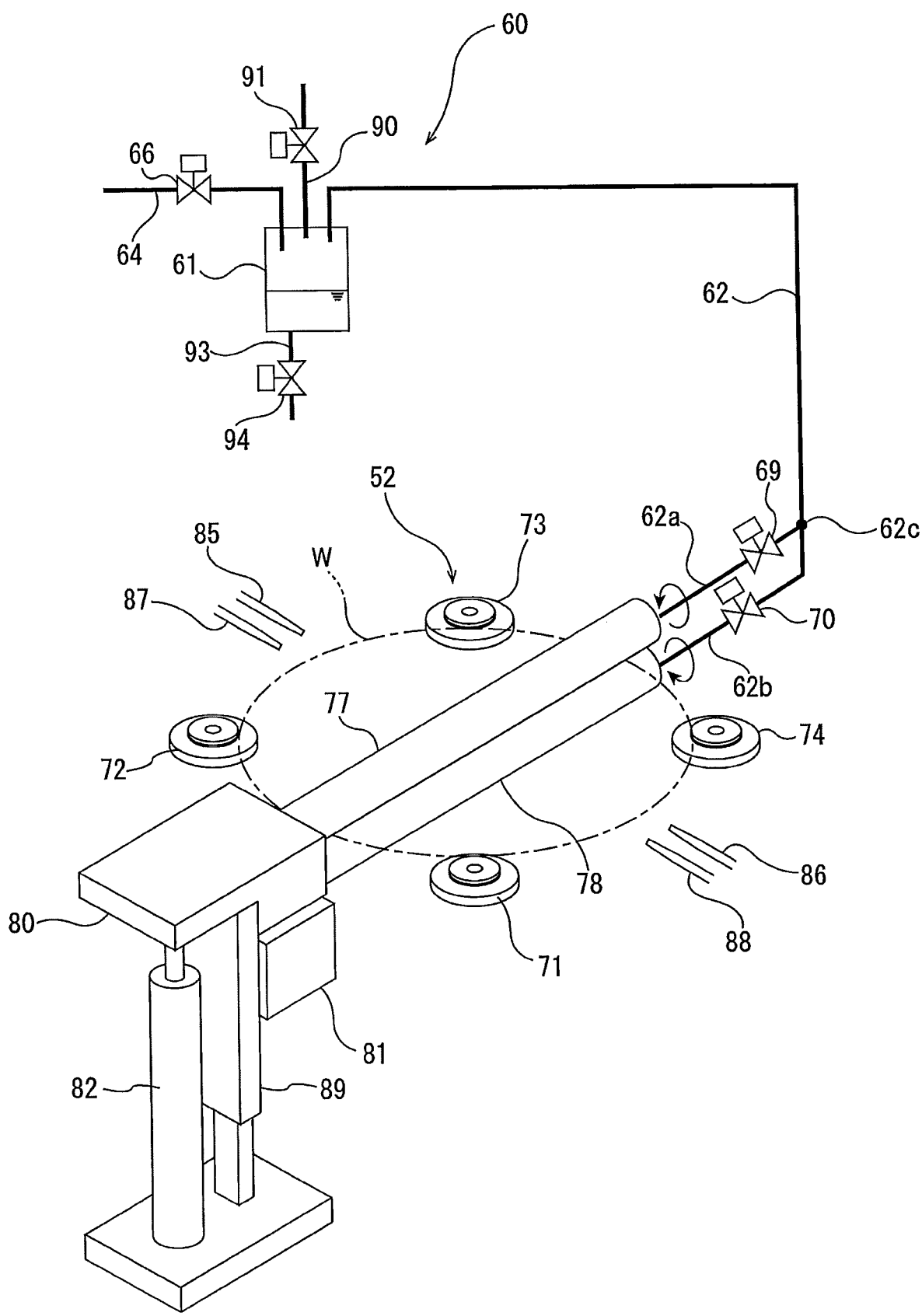
FIG. 2 is a perspective view schematically showing a substrate cleaning apparatus according to an embodiment.

FIG. 2 is a perspective view schematically showing the substrate cleaning apparatus according to an embodiment. The substrate cleaning apparatus shown in FIG. 2 is used as the primary cleaning unit and/or the secondary cleaning unit installed in the substrate processing apparatus shown in FIG. 1.

As shown in FIG. 2, the substrate cleaning apparatus includes a substrate holding mechanism 52 having four holding rollers 71, 72, 73, 74 for holding a periphery of a wafer W, which is an example of a substrate, and rotating the wafer W about its own axis, cylindrical roll sponges (or roll cleaning tools) 77, 78 which are brought into contact with upper and lower surfaces of the wafer W, respectively, rotating mechanisms 80, 81 for rotating the roll sponges 77, 78 about their respective axes, upper pure-water supply nozzles 85, 86 for supplying pure water to the upper surface of the wafer W, and upper liquid-chemical supply nozzles 87, 88 for supplying a liquid chemical to the upper surface of the wafer W. Though not shown diagrammatically, the substrate cleaning apparatus further includes lower pure-water supply nozzles for supplying pure water to the lower surface of the wafer W, and lower liquid-chemical supply nozzles for supplying a liquid chemical to the lower surface of the wafer W. The liquid chemical and the pure water used in this embodiment are examples of a cleaning liquid for cleaning the wafer W. The upper liquid-chemical supply nozzles 87, 88, the upper pure-water supply nozzles 85, 86, the lower liquid-chemical supply nozzles, and the lower pure-water supply nozzles serve as cleaning-liquid supply nozzles each for supplying the cleaning liquid to the wafer W.

The axes of the roll sponges 77, 78 extend parallel to the surface of the wafer W held by the holding rollers 71, 72, 73, 74. The holding rollers 71, 72, 73, 74 are movable in directions closer to and away from the wafer W by means of not-shown drive mechanisms (e.g. air cylinders). Further, at least two of the holding rollers 71, 72, 73, 74 are coupled to a roller rotating mechanism which is not shown in the drawings.

Only one ends of the roll sponges 77, 78 may be supported by the rotating mechanisms 80, 81 in a cantilevered manner, or both ends of each roll sponge 77, 78 may be supported by using a roll arm (not shown). The roll arm has, for example, an arm portion extending from the rotating mechanism 80 or 81 in the longitudinal direction of the roll sponge 77 or 78, and a support portion extending vertically from the arm portion. The one ends of the roll sponges 77, 78 are supported by the rotating mechanisms 80, 81, respectively, while the other ends of the roll sponges 77, 78 are rotatably supported by the support portions.

The rotating mechanism 80 for rotating the upper roll sponge 77 is mounted to a guide rail 89 that guides the vertical movement of the rotating mechanism 80. The rotating mechanism 80 is supported by a load generator 82 so that the rotating mechanism 80 and the upper roll sponge 77 are moved vertically by the load generator 82. Though not shown diagrammatically, the rotating mechanism 81 for rotating the lower roll sponge 78 is supported by a guide rail, and the rotating mechanism 81 and the lower roll sponge 78 are moved vertically by a load generator. A motor-drive mechanism using a ball screw or an air cylinder may be used as the load generators. The rotating mechanisms 80, 81, the load generator 82, and the load generator (not shown) for vertically moving the lower roll sponge 78 are coupled to the above-described controller 5 (see FIG. 1), so that operations of the rotating mechanisms and the load generators are controlled by the controller 5.

When cleaning of the wafer W is to be performed, the roll sponges 77, 78 are moved closer to each other and come into contact with the upper and lower surfaces of the wafer W. Positions at which the roll sponges 77, 78 are brought into contact with the upper and lower surfaces of the wafer W are cleaning positions of the roll sponges 77, 78. Though not shown diagrammatically, it is also possible to use a substrate holding mechanism for holding a wafer W in a vertical position, and to rotate the wafer W in the vertical position. In that case, the roll sponges 77, 78 are moved horizontally.

After the cleaning of the wafer W is terminated, the roll sponges 77, 78 may be moved to standby positions with use of not-shown moving mechanisms. The standby position of the upper roll sponge 77 lies, for example, lateral to or above the holding rollers 71, 72, 73, 74 of the substrate holding mechanism 52. The standby position of the lower roll sponge 78 lies, for example, below the holding rollers 71, 72, 73, 74 of the substrate holding mechanism 52. In the case where the standby position of the roll sponge 77 lies lateral to the holding rollers 71, 72, 73, 74, the roll sponge 77 first moves upward from the cleaning position, and then moves horizontally until it reaches the standby position, where the roll sponge 77 is on standby. In the case where the standby positions of the roll sponges 77, 78 lie above and below the holding rollers 71, 72, 73, 74, the roll sponges 77, 78 move upward and downward, respectively, from their cleaning positions to the respective standby positions, where the roll sponges 77, 78 stand by. In the case where the standby position of the roll sponge 77 lies lateral to the holding rollers 71, 72, 73, 74, the roll sponge 77 may first move upward from the cleaning position, then move horizontally, and subsequently move downward until it reaches the standby position, where the roll sponge 77 is on standby.

The substrate cleaning apparatus further includes a suction system 60 coupled to the roll sponges 77, 78. The suction system 60 is configured to suck the liquid chemical, which is an example of the cleaning liquid, from the wafer W through the roll sponges 77, 78 while the roll sponges 77, 78 are cleaning the wafer W. As shown in FIG. 2, the suction system 60 includes a gas-liquid separation tank 61, a vacuum line 64 coupled to the gas-liquid separation tank 61, and a cleaning liquid suction pipe 62 though which the roll sponges (roll cleaning tools) 77, 78 are coupled to the gas-liquid separation tank 61. The cleaning liquid suction pipe 62 has branch pipes 62a, 62b, which are coupled to the roll sponges 77, 78, respectively. The branch pipes 62a, 62b of the cleaning liquid suction pipe 62 branch off at a branch point 62c. The branch pipe 62a is coupled to the upper roll sponge 77, while the branch pipe 62b is coupled to the lower roll sponge 78. An end of the cleaning liquid suction pipe 62, which is opposite from the branch pipes 62a, 62b, is coupled to the gas-liquid separation tank 61. Thus, the cleaning liquid suction pipe 62 is coupled to the vacuum line 64 via the gas-liquid separation tank 61.

Though not shown diagrammatically, the vacuum line 64 is coupled to a vacuum system or a vacuum pump provided in a factory in which the substrate processing apparatus is installed. The branch pipe 62a of the cleaning liquid suction pipe 62 is equipped with a suction valve 69, the branch pipe 62b of the cleaning liquid suction pipe 62 is equipped with a suction valve 70, and the vacuum line 64 is equipped with a main vacuum valve 66. The suction valve 69, the suction valve 70, and the main vacuum valve 66 are coupled to the above-described controller 5 (see FIG. 1), so that opening and closing operations of the suction valve 69, the suction valve 70, and the main vacuum valve 66 are controlled by the controller 5. The opening and closing operations of the suction valve 69 are controlled by the controller 5 independently of the opening and closing operations of the suction valve 70.

A vent pipe 90 is coupled to the upper portion of the gas-liquid separation tank 61, and a drain pipe 93 is coupled to the bottom of the gas-liquid separation tank 61. The vent pipe 90 is equipped with a vent valve 91, and the drain pipe 93 is equipped with a drain valve 94. The vent valve 91 and the drain valve 94 are coupled to the above-described controller 5 (see FIG. 1), so that opening and closing operations of the vent valve 91 and the drain valve 94 are controlled by the controller 5.

Figure 3:
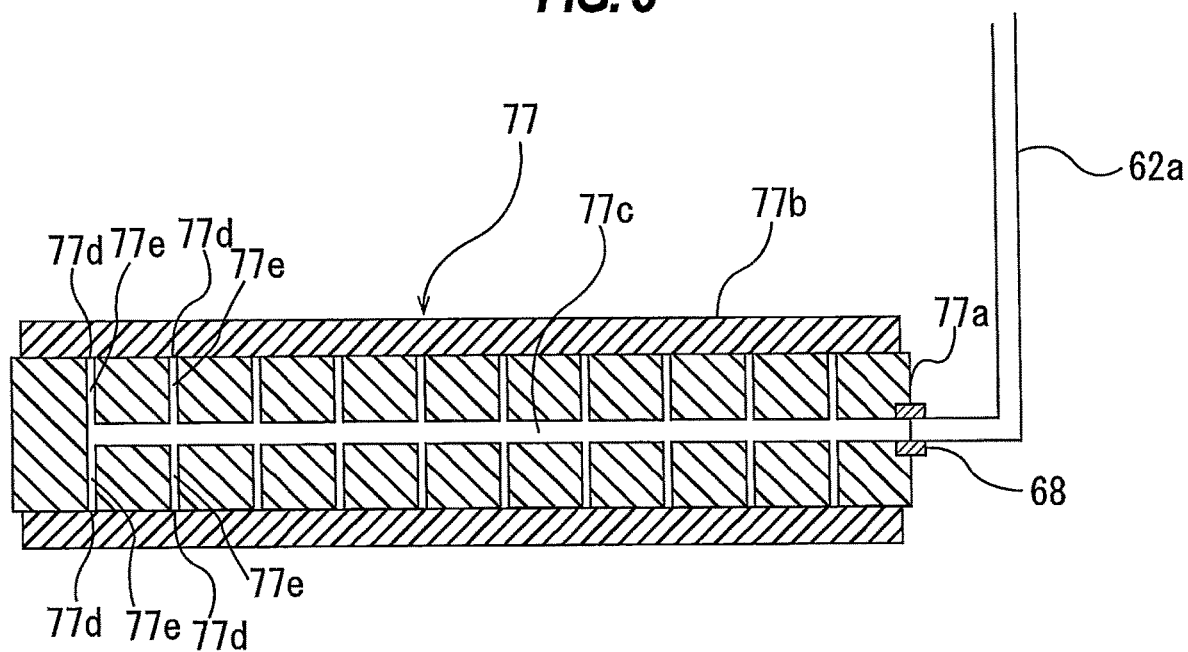
FIG. 3 is a cross-sectional view of a roll cleaning tool shown in FIG. 2.

FIG. 3 is a cross-sectional view of the roll sponge 77 shown in FIG. 2. As shown in FIG. 3, the roll sponge 77 includes a cylindrical shaft 77a and a hollow cylindrical sponge member 77b that covers a peripheral surface of the shaft 77a. The sponge member 77b may be comprised of a PVA (polyvinyl alcohol) sponge or a sponge of non-woven fabric comprising fibers bound by resin and having fine pores formed between the fibers. The sponge member 77b, formed of the PVA sponge, can easily remove fine particles present on the surface of the wafer W. The sponge member 77b, formed of non-woven fabric, is harder than the PVA sponge, and can therefore remove particles which are strongly attached to the surface of the wafer W.

The lower roll sponge 78 has the same structure as the upper roll sponge 77, while the sponge member of the lower roll sponge 78 may be made of the same material as or a different material from the material of the sponge member 77b of the upper roll sponge 77. In one example, the sponge member 77b of the upper roll sponge 77 may be made of PVA, while the sponge member of the lower roll sponge 78 may be made of non-woven fabric.

The shaft 77a has a main flow passage 77c formed therein and extending in a longitudinal direction of the shaft 77a. The main flow passage 77c is formed on a central axis of the shaft 77a. A plurality of openings 77d are provided in the peripheral surface of the shaft 77a. The shaft 77a further has a plurality of branch flow passages 77e that provide fluid communication between the main flow passage 77c and the openings 77d. These openings 77d are arranged at regular intervals in a circumferential direction of the shaft 77a and are also arranged at regular intervals in the longitudinal direction of the shaft 77a. Each branch flow passage 77e extends in a radial direction of the shaft 77a from the main flow passage 77c to the opening 77d.

One end of the main flow passage 77c is coupled to the branch pipe 62a of the cleaning liquid suction pipe 62 of the suction system 60, while other end is closed. The main flow passage 77c and the cleaning liquid suction pipe 62 are coupled to each other by a sealing member 68. This sealing member 68 functions to seal a gap between the main flow passage 77c and the cleaning liquid suction pipe 62 while allowing the roll sponge 77 to rotate about its axis. A rotary seal, for example DYNALIP (registered trademark), is preferably used as the sealing member 68.

Figure 4:
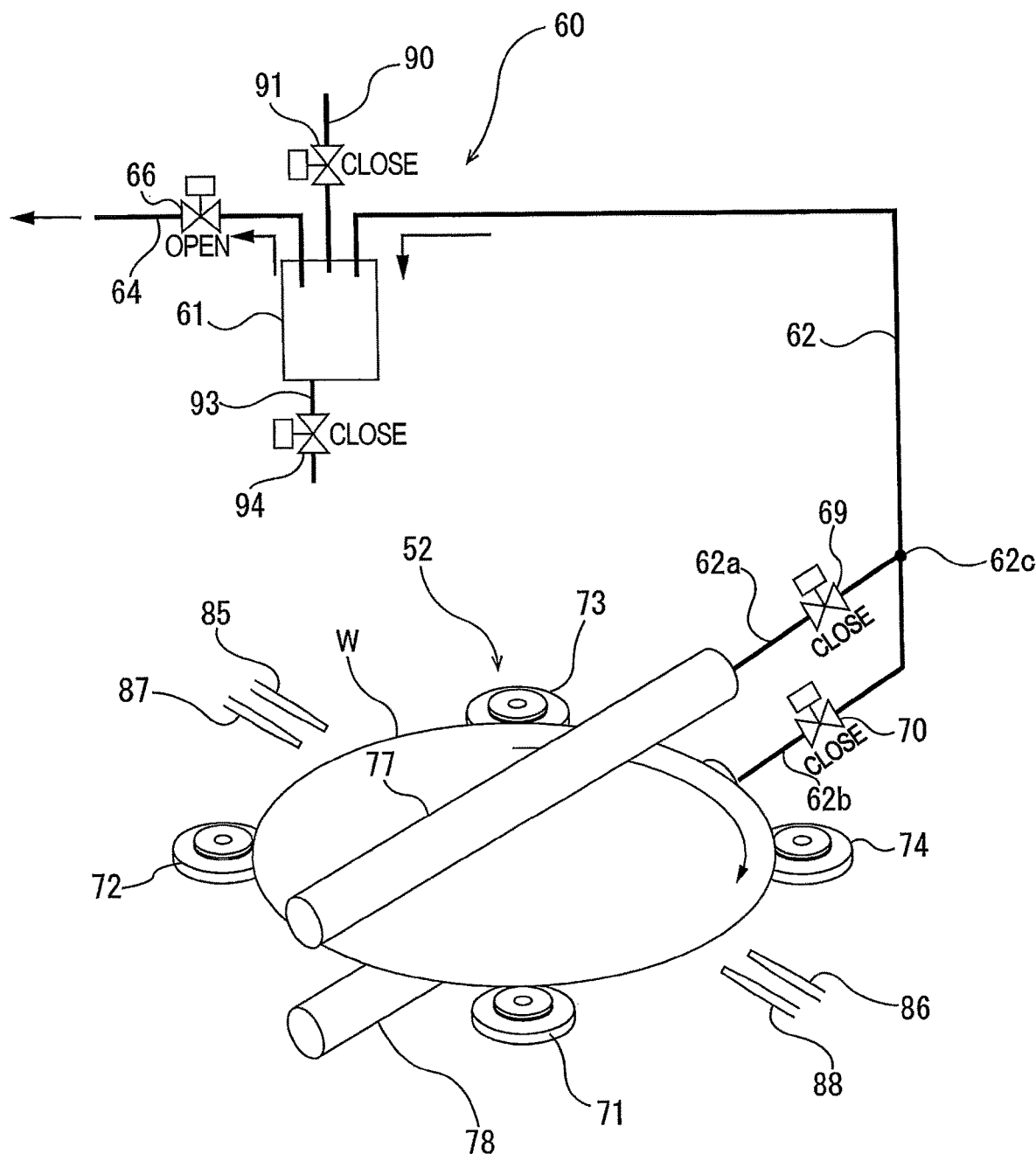
FIG. 4 is a diagram showing the substrate cleaning apparatus in a cleaning standby state.

A cleaning process for the wafer W will now be described. First, as shown in FIG. 4, with the periphery of the wafer W held by the holding rollers 71, 72, 73, 74, at least two of the holding rollers 71, 72, 73, 74 are rotated by the roller rotating mechanisms (not shown) to thereby rotate the wafer W about its axis. While the suction valve 69, the suction valve 70, the vent valve 91, and the drain valve 94 are in a closed state, the controller 5 opens the main vacuum valve 66, thereby forming a vacuum in the gas-liquid separation tank 61 and in a part of the cleaning liquid suction pipe 62.

Figure 5:
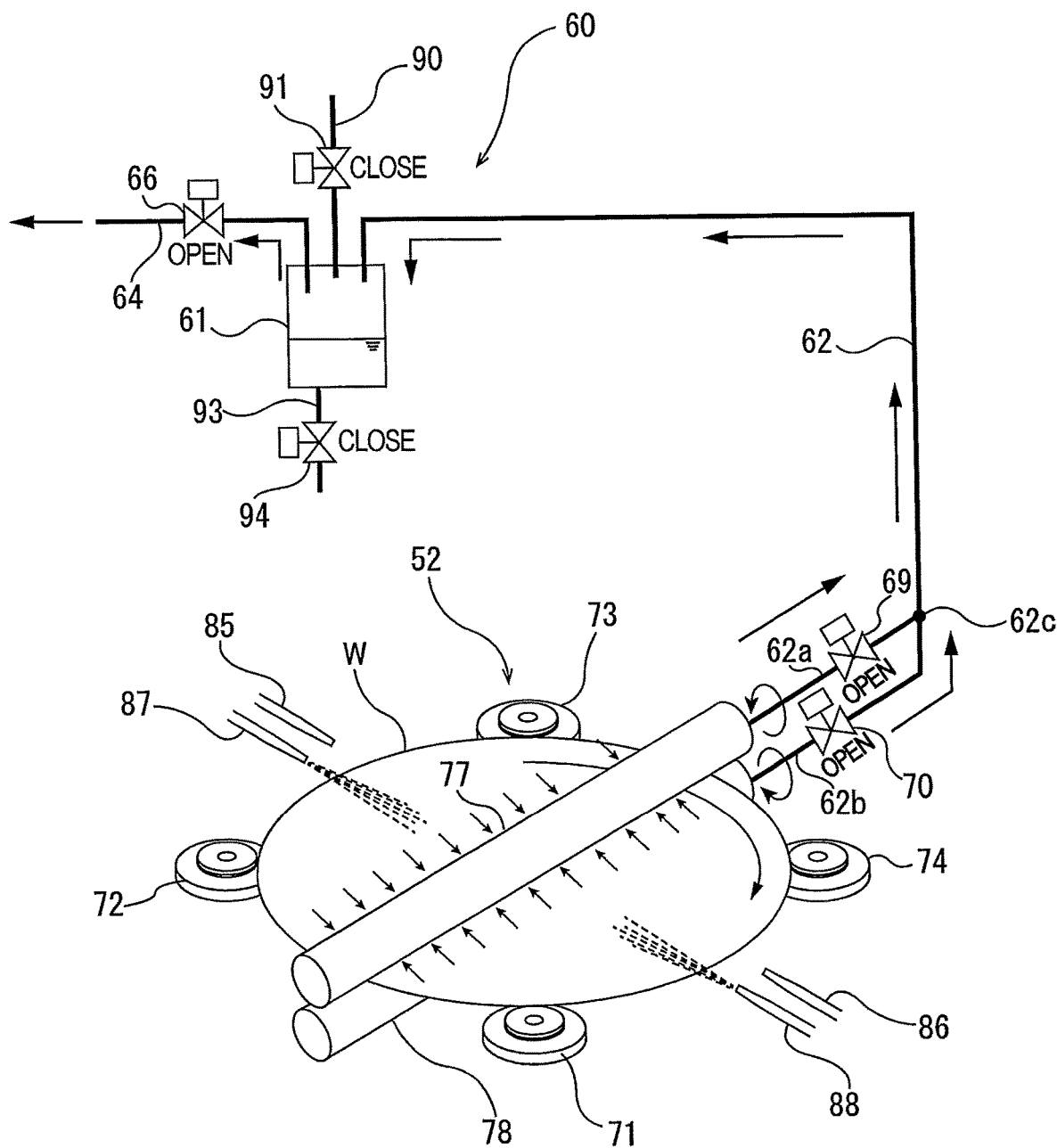
FIG. 5 is a diagram showing the substrate cleaning apparatus in a scrub-cleaning state.

Next, as shown in FIG. 5, a liquid chemical, as the cleaning liquid, is supplied from the upper liquid-chemical supply nozzles 87, 88 and the lower liquid-chemical supply nozzles (not shown) onto the upper surface and the lower surface of the wafer W. Further, the controller 5 opens the suction valve 69 and the suction valve 70, thereby forming a vacuum in the roll sponges 77, 78. With the vacuum produced in the roll sponges 77, 78, the roll sponges 77, 78 are rotated about their respective axes and are rubbed against the upper surface and the lower surface, respectively, of the wafer W to thereby clean the upper and lower surfaces of the wafer W in the presence of the liquid chemical.

While the roll sponges 77, 78 are cleaning the wafer W, the controller 5 keeps the suction valve 69, the suction valve 70, and the main vacuum valve 66 open and keeps the vent valve 91 and the drain valve 94 closed. Accordingly, during cleaning of the wafer W, the suction system 60 sucks the liquid chemical as the cleaning liquid from the wafer W. More specifically, the liquid chemical present on the upper and lower surfaces of the wafer W is sucked through the roll sponges 77, 78. The liquid chemical flows through the sponge members 77b of the roll sponges 77, 78, the branch flow passages 77e, the main flow passages 77c, and the cleaning liquid suction pipe 62 in this order, so that the liquid chemical is delivered to the gas-liquid separation tank 61. The liquid chemical that has been sucked from the upper and lower surfaces of the wafer W is collected in the gas-liquid separation tank 61.

After the scrub cleaning, rinsing of the wafer W is performed by supplying pure water, serving as another exemplary cleaning liquid, onto the rotating wafer W from the upper pure-water supply nozzles 85, 86 and the not-shown lower pure-water supply nozzles. Rinsing of the wafer W may be performed while rubbing the roll sponges 77, 78 against the upper and lower surfaces of the wafer W or while keeping the roll sponges 77, 78 apart from the upper and lower surfaces of the wafer W. In the case of rinsing the wafer W while rubbing the roll sponges 77, 78 against the upper and lower surfaces of the wafer W, as in the above-described wafer cleaning using the liquid chemical, the pure water is supplied onto the upper and lower surfaces of the wafer W, while the pure water is sucked from the upper and lower surfaces of the wafer W through the roll sponges 77, 78 by the suction system 60. The liquid chemical and the pure water used in this embodiment each serve as the cleaning liquid for cleaning the wafer W.

According to this embodiment, particles, such as polishing debris and abrasive particles which have been removed from the upper and lower surfaces of the wafer W by the roll sponges 77, 78, are immediately sucked and removed, together with the cleaning liquid (i.e., the liquid chemical and/or the pure water), from the upper and lower surfaces of the wafer W through the roll sponges 77, 78. Because a suction force is generated in the roll sponges 77, 78 during cleaning of the wafer W, particles that have accumulated in the roll sponges 77, 78 are unlikely to leave the roll sponges 77, 78. Further, particles that have been once removed from the wafer W are sucked into the roll sponges 77, 78 together with the cleaning liquid before the particles are re-attached to the upper and lower surfaces of the wafer W. Therefore, this embodiment can prevent back contamination of the wafer W.

Figure 6:
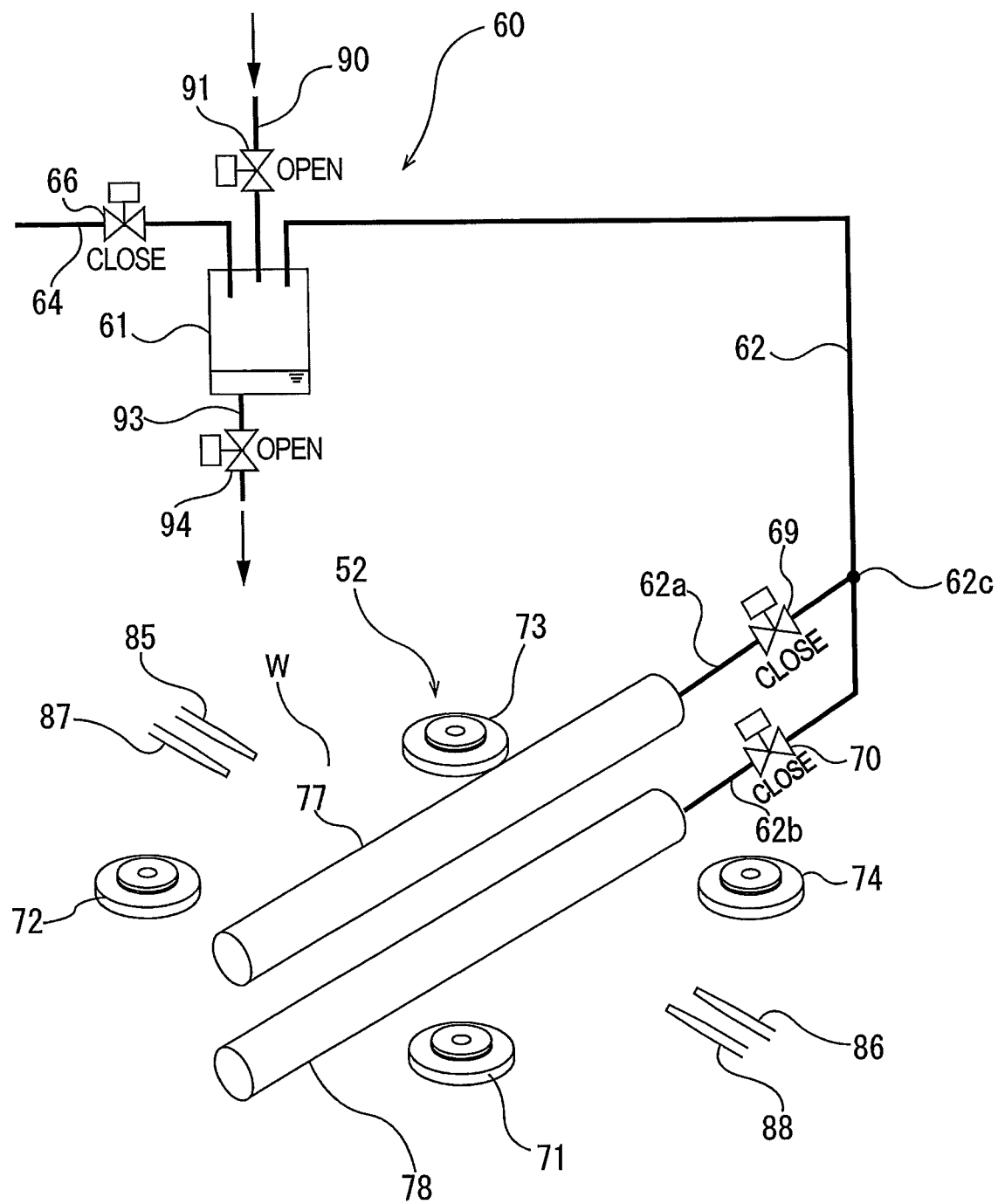
FIG. 6 is a diagram showing a drainage state.

The cleaned wafer W is taken out of the substrate holding mechanism 52, and transported to the drying unit in the drying chamber 194 shown in FIG. 1. The cleaning liquid (i.e., the liquid chemical and/or the pure water) collected in the gas-liquid separation tank 61 is discharged from the gas-liquid separation tank 61 until the next wafer is transported to the substrate holding mechanism 52. More specifically, as shown in FIG. 6, the controller 5 closes the suction valve 69, the suction valve 70, and the main vacuum valve 66, and opens the vent valve 91 and the drain valve 94. The internal space of the gas-liquid separation tank 61 communicates with a clean atmosphere in a clean room via the vent pipe 90, while the cleaning liquid is discharged from the gas-liquid separation tank 61 through the drain pipe 93. In order to discharge the cleaning liquid from the gas-liquid separation tank 61 in a short time, compressed air may be supplied through the vent pipe 90 into the gas-liquid separation tank 61.

Upon the completion of discharge of the cleaning liquid, the controller 5 closes the vent valve 91 and the drain valve 94. Further, as shown in FIG. 4, the controller 5 opens the main vacuum valve 66 after the next wafer is held by the substrate holding mechanism 52. The suction valve 69 and the suction valve 70 remain closed. In this manner, the cleaning-standby state illustrated in FIG. 4, the scrub-cleaning state illustrated in FIG. 5 and the drainage state illustrated in FIG. 6 are repeated. The discharge of the cleaning liquid from the gas-liquid separation tank 61, illustrated in FIG. 6, may be performed every time a wafer is cleaned or after a plurality of wafers are cleaned.

Figure 7:
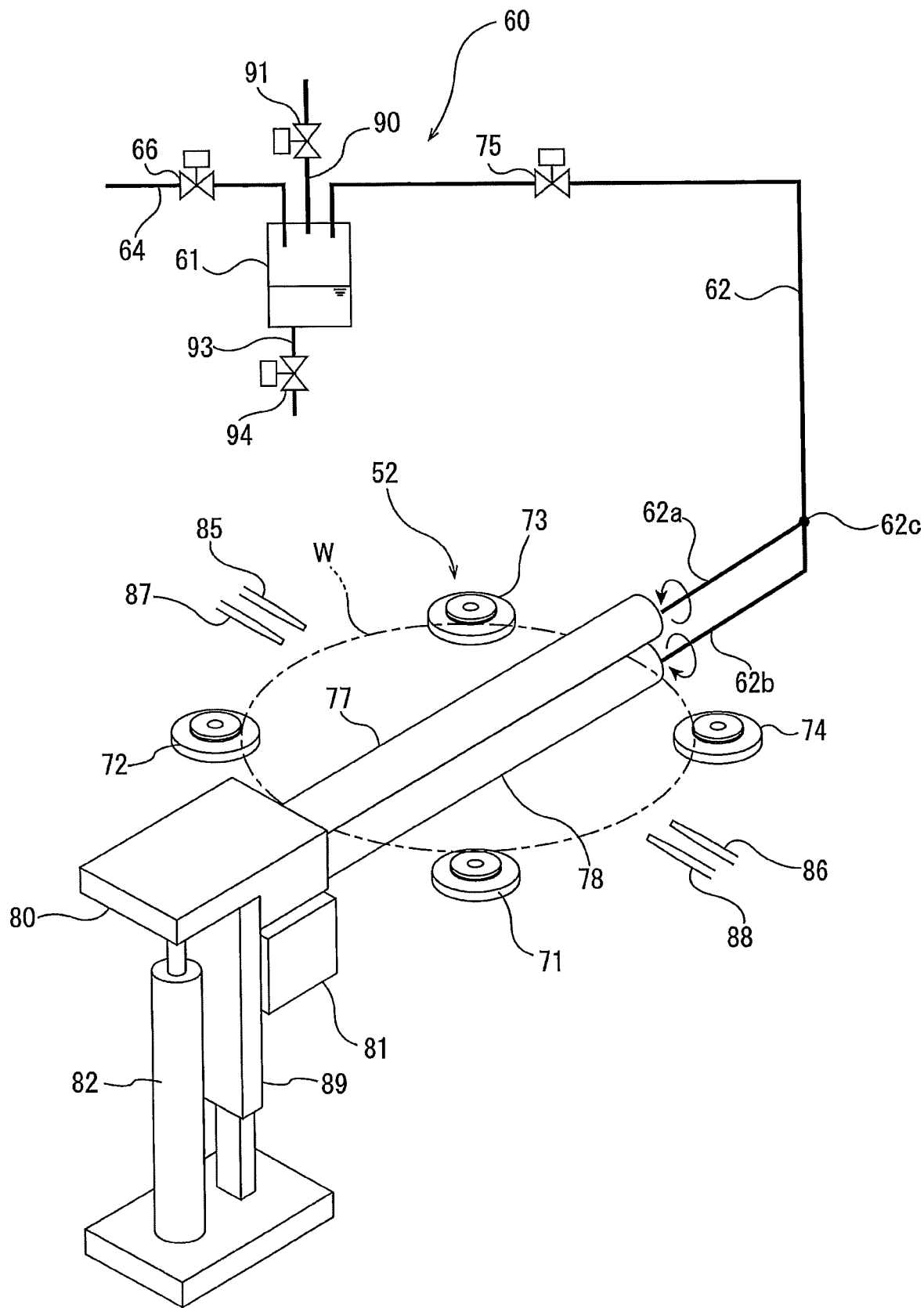
FIG. 7 is a schematic view showing a variation of the substrate cleaning apparatus shown in FIG. 2.

As shown in FIG. 7, the suction system 60 of the substrate cleaning apparatus may include a suction valve 75 which is common to the roll sponges 77, 78, instead of the suction valves 69, 70 attached to the branch pipes 62a, 62b, respectively. FIG. 7 is a schematic view showing a variation of the substrate cleaning apparatus shown in FIG. 2. The suction valve 75 is located between the branch point 62c and the gas-liquid separation tank 61. The suction valve 75 is coupled to the above-described controller 5 (see FIG. 1), so that opening and closing operations of the suction valve 75 are controlled by the controller 5.

The opening and closing operations of the suction valve 75 are the same as the opening and closing operations of the suction valves 69, 70 described above with reference to FIGS. 4, 5 and 6. More specifically, the controller 5 keeps the suction valve 75 closed during the cleaning-standby state and the drainage state, and keeps the suction valve 75 open during the scrub-cleaning state. The opening and closing operations of the main vacuum valve 66, the vent valve 91, and the drain valve 94 in this embodiment are the same as the opening and closing operations of the main vacuum valve 66, the vent valve 91, and the drain valve 94 described above with reference to FIGS. 4, 5 and 6. More specifically, the controller 5 opens the main vacuum valve 66 and closes the vent valve 91 and the drain valve 94 in the cleaning-standby state. The controller 5 keeps the main vacuum valve 66 open and keeps the vent valve 91 and the drain valve 94 closed during the scrub-cleaning state. Further, the controller 5 closes the main vacuum valve 66 and opens the vent valve 91 and the drain valve 94 in the drainage state. Since the suction valve 75 and the main vacuum valve 66 are opened by the controller 5 during the scrub-cleaning state, the cleaning liquid present on the supper and lower surfaces of the wafer W is sucked through the roll sponges 77, 78 and delivered to the gas-liquid separation tank 61.

While both of the roll sponges 77, 78 are coupled to the suction system 60 in the embodiments shown in FIGS. 2 and 7, only the upper roll sponge 77 for cleaning a polished surface of a wafer W may be coupled to the suction system 60. In such a case where only the upper roll sponge 77 is coupled to the suction system 60, the branch pipe 62b and the suction valve 70 are omitted in the embodiment shown in FIG. 2, and the branch pipe 62b is omitted in the embodiment shown in FIG. 7.

Figure 8:
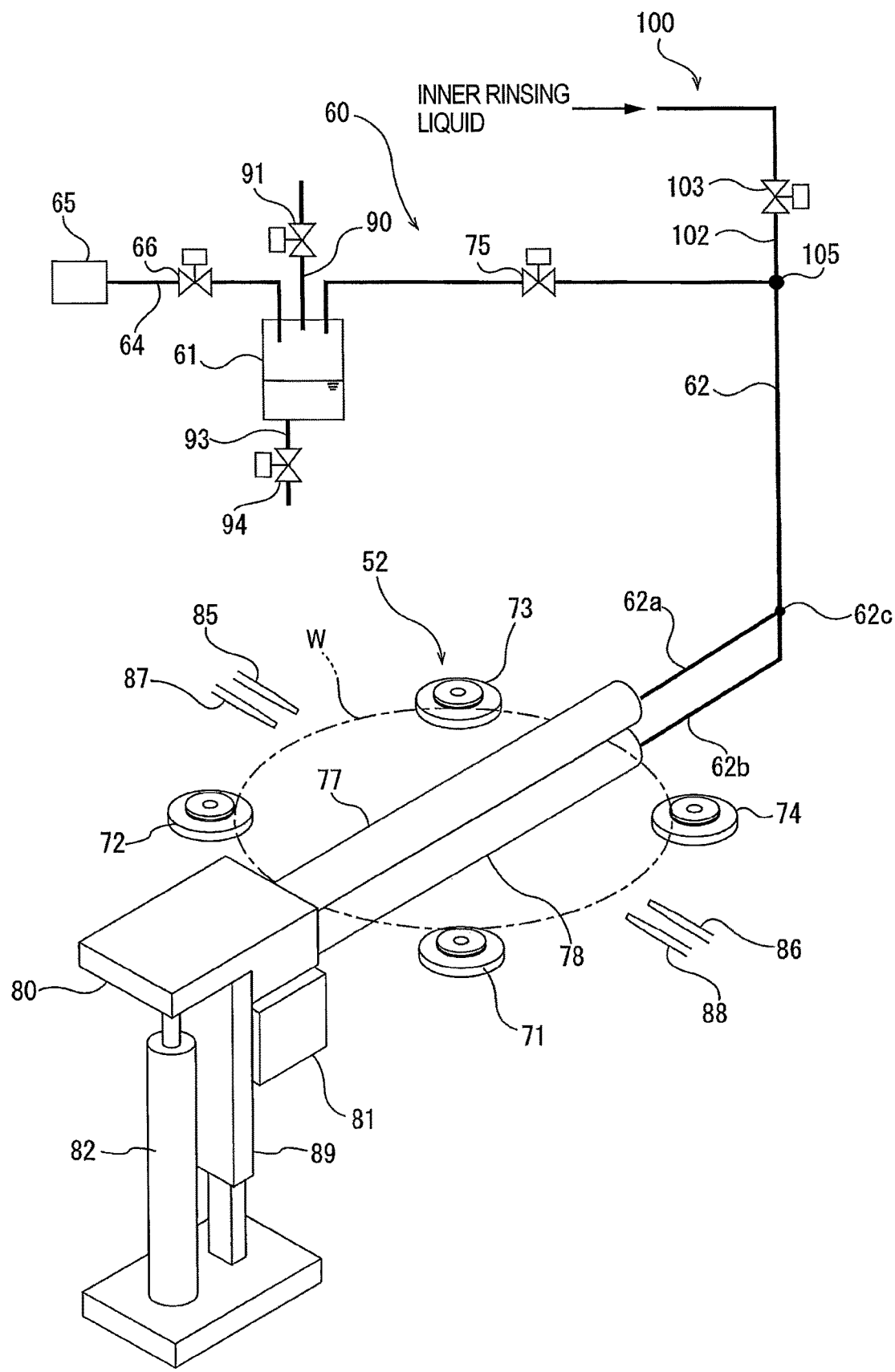
FIG. 8 is a schematic view illustrating another embodiment of the substrate cleaning apparatus.

FIG. 8 is a diagram illustrating another embodiment of the substrate cleaning apparatus. The substrate cleaning apparatus shown in FIG. 8 further includes an inner rinsing liquid supply system 100 for rinsing the roll sponges 77, 78 from within. The construction of this embodiment, other than the inner rinsing liquid supply system 100 and suction valve 75, common to the roll sponges 77, 78, instead of the suction valves 69, 70 attached to the branch pipes 62a, 62b, is the same as the construction of the embodiment shown in FIG. 2, and hence a duplicate description thereof is omitted.

As shown in FIG. 8, the inner rinsing liquid supply system 100 includes an inner rinsing liquid supply line 102 coupled to the cleaning liquid suction pipe 62, and an inner rinsing liquid supply valve 103 attached to the inner rinsing liquid supply line 102. Though not shown diagrammatically, the inner rinsing liquid supply line 102 is coupled to an inner rinsing liquid supply source, such as a pure water supply port provided in a factory in which the substrate processing apparatus is installed. The inner rinsing liquid supply line 102 is coupled to the cleaning liquid suction pipe 62 at a connection point 105. In this embodiment, the suction valve 75 shown in FIG. 7 is provided instead of the suction valve 69 and the suction valve 70 shown in FIG. 2. The connection point 105 is located between the suction valve 75 and the roll sponges 77, 78. Thus, the suction valve 75 is located between the connection point 105 and the gas-liquid separation tank 61. The inner rinsing liquid supply valve 103 and the suction valve 75 are coupled to the controller 5 (see FIG. 1), so that opening and closing operations of the inner rinsing liquid supply valve 103 and the suction valve 75 are controlled by the controller 5.

In order to supply an inner rinsing liquid (e.g. pure water) into the roll sponges 77, 78, the controller 5 closes the suction valve 75 and then opens the inner rinsing liquid supply valve 103. The main vacuum valve 66 may be either closed or open. When the inner rinsing liquid supply valve 103 is opened, the inner rinsing liquid is supplied through the inner rinsing liquid supply line 102 and the cleaning liquid suction pipe 62 into the interiors of the roll sponges 77, 78. The inner rinsing liquid flows through the main flow passages 77c, the branch flow passages 77e, the openings 77d, and the sponge members 77b (see FIG. 3) of the roll sponges 77, 78, and is discharged to the outside of the roll sponges 77, 78. The inner rinsing liquid washes away particles accumulated in the sponge members 77b, thus removing the particles from the roll sponges 77, 78. Self-cleaning of the roll sponges 77, 78 is effected in this manner.

The self-cleaning of the roll sponges 77, 78 is carried out after a cleaned wafer W is taken out of the substrate holding mechanism 52 and before the next wafer is transported to the substrate holding mechanism 52. Further, the self-cleaning is carried out when the roll sponges 77, 78 are in the above-described standby positions. The self-cleaning may be carried out simultaneously with the discharge of the cleaning liquid (i.e., the liquid chemical and/or the pure water) from the gas-liquid separation tank 61. In that case, the main vacuum valve 66 is closed and the vent valve 91 and the drain valve 94 are opened by the controller 5. Such self-cleaning of the roll sponges 77, 78 can reduce a frequency of maintenance or replacement of the roll sponges 77, 78.

Figure 9:
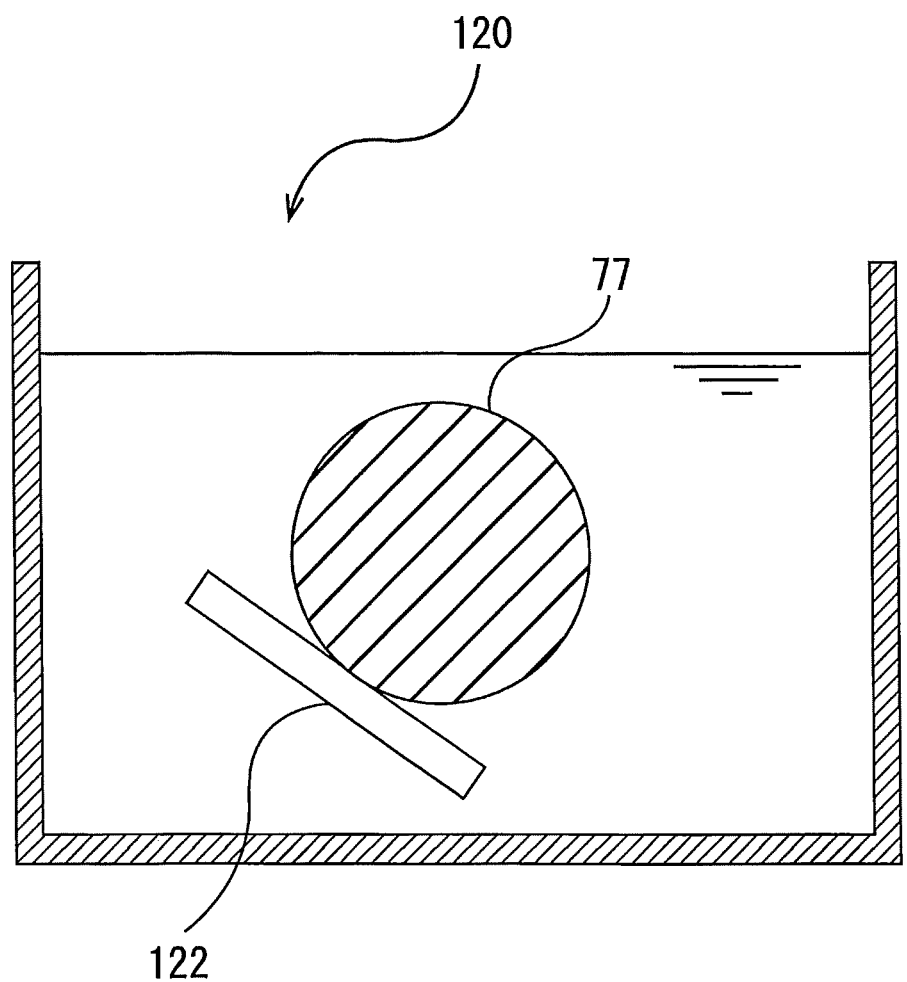
FIG. 9 is a schematic view showing a rinsing chamber for performing self-cleaning of a roll cleaning tool in a standby position.

As shown in FIG. 9, instead of the above-described inner rinsing liquid supply system 100, a rinsing chamber 120 may be provided in the standby position of the upper roll sponge 77. FIG. 9 is a schematic view showing an embodiment of the rinsing chamber 120 for performing self-cleaning of the upper roll sponge 77 in the standby position.

The rinsing chamber 120 is disposed in the standby position which is located lateral to the holding rollers 71, 72, 73, 74 of the substrate holding mechanism 52. As shown in FIG. 9, a rinsing liquid, such as pure water, is stored in the rinsing chamber 120. A cleaning member 122, which can make contact with the peripheral surface of the roll sponge 77, is disposed in the rinsing chamber 120. The cleaning member 122 of this embodiment is a cleaning plate which may be a quartz plate or a sapphire glass plate. The peripheral surface of the roll sponge 77 is brought into contact with a surface of the cleaning member 122, which is a flat smooth surface whose surface roughness is strictly controlled.

The roll sponge 77 is moved to the rinsing chamber 120 by a not-shown moving mechanism, and immersed in the rinsing liquid stored in the rinsing chamber 120. While the roll sponge 77 is rotating about its axis, the roll sponge 77 is pressed against the cleaning member 122, thereby forcing out particles, accumulated in the roll sponge 77, into the rinsing liquid. Such self-cleaning of the roll sponge 77 can reduce a frequency of maintenance or replacement of the roll sponge 77. Since the surface of the cleaning member 122, which can make contact with the peripheral surface of the roll sponge 77, is a flat smooth surface, wear of the roll sponge 77 can be reduced as compared to a rough surface having surface irregularities. Further, particles that have been forced out of the roll sponge 77 hardly accumulate on the surface of the cleaning member 122. Accordingly, it is unlikely that the roll sponge 77 will be contaminated by particles remaining on the surface of the cleaning member 122. Self-cleaning of the roll sponge 77 can thus be performed effectively.

Yet another embodiment of the substrate cleaning apparatus will now be described. In the following descriptions, the substrate cleaning apparatus will be referred to as a cleaning module, which has the same meaning as the cleaning unit as discussed in the previous embodiments.

Figure 10:
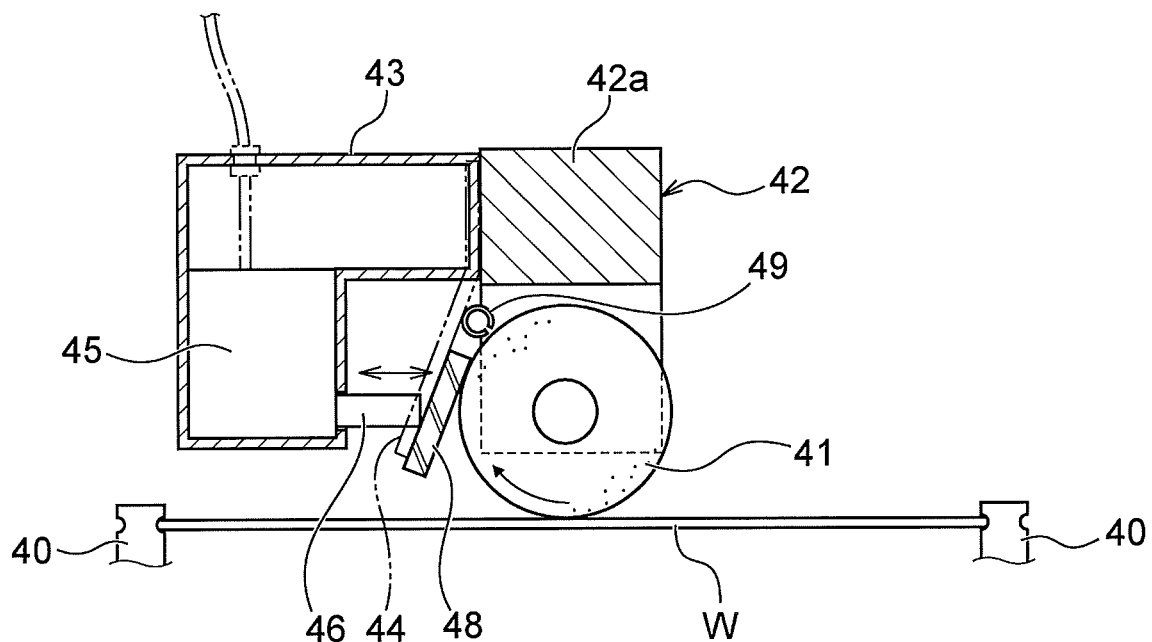
FIG. 10 is a diagram showing another embodiment of a cleaning module (substrate cleaning apparatus) installed in the substrate processing apparatus shown in FIG. 1, and is a partial cross-sectional front view of the cleaning module.
Figure 11:
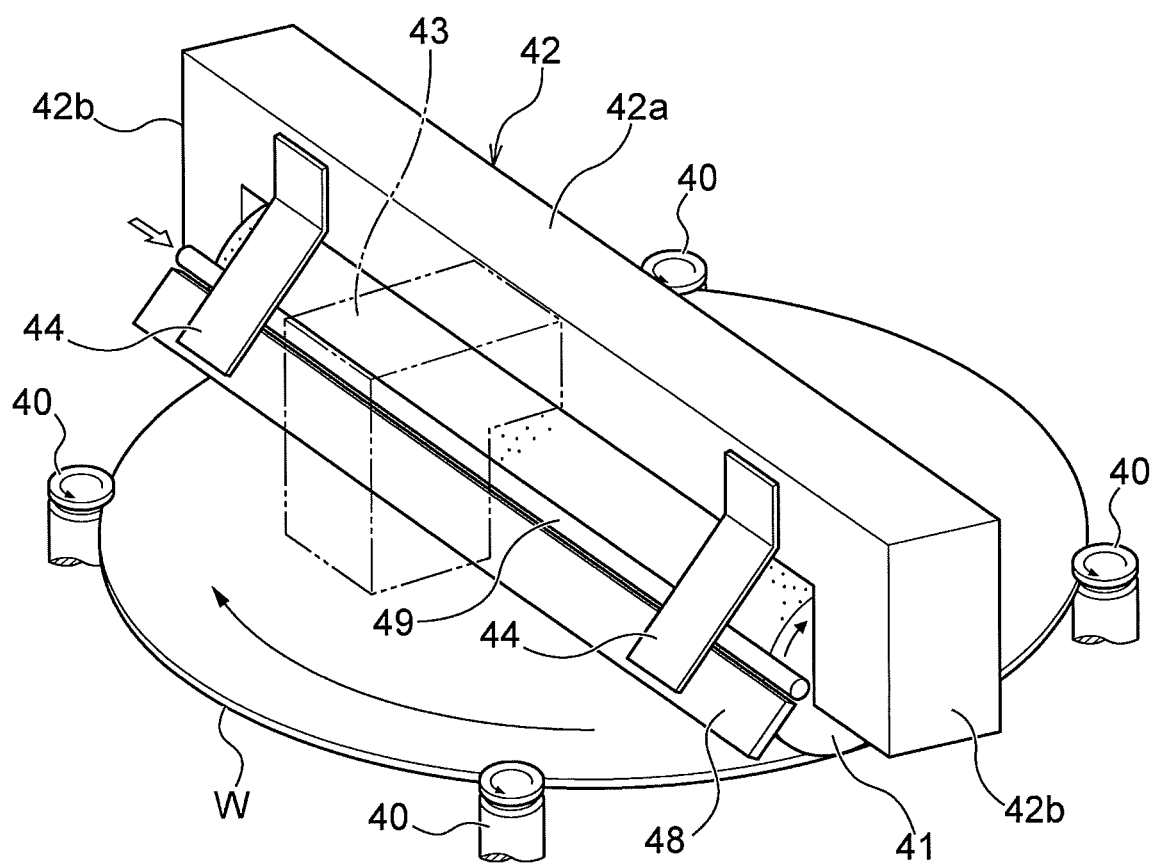
FIG. 11 is a diagram showing another embodiment of the cleaning module installed in the substrate processing apparatus shown in FIG. 1, and is a perspective view of the cleaning module.

FIGS. 10 and 11 are diagrams each showing another embodiment of the cleaning module (or the substrate cleaning apparatus) installed in the substrate processing apparatus shown in FIG. 1. FIG. 10 is a partial cross-sectional front view of the cleaning module, and FIG. 11 is a perspective view of the cleaning module.

As shown in FIGS. 10 and 11, the cleaning module (substrate cleaning apparatus) includes a plurality of spindles 40 for holding a periphery of a substrate W and rotating the substrate W in a horizontal position, and a roll sponge 41 as a cleaning member which can come into contact with a surface of the substrate W being rotated by the spindles 40 to thereby scrub-clean the substrate surface. The roll sponge 41 is held by a roll arm 42, and is configured to rotate about its axis. The roll sponge 41 has a cylindrical shape which is slightly longer than the diameter of the substrate W. The roll sponge 41 may be a PVA (polyvinyl alcohol) sponge which can easily remove fine particles upon cleaning of the substrate surface.

The roll arm 42 includes a long arm portion 42a located above the roll sponge 41 and extending in the longitudinal direction of the roll sponge 41, and support portions 42b extending downward from both ends of the arm portion 42a. Both ends of the roll sponge 41 are supported by the support portions 42b. A housing 43, in which an actuator 45 is housed, is secured to the arm portion 42a of the roll arm 42. The actuator 45 is fixed to the housing 43, so that the housing 43 and the actuator 45 move together as the roll arm 42 moves. A waterproof member is preferably used as the housing 43 in order to prevent a liquid, such as a cleaning liquid, from entering the housing 43.

A pair of right and left mounting members 44, e.g. brackets, is secured to the arm portion 42a of the roll arm 42. The housing 43 is located between these mounting members 44. A cleaning plate 48 in a form of flat plate is attached to the mounting members 44. The cleaning plate 48 may be a quartz plate or a sapphire glass plate. The cleaning plate 48 serves as a self-cleaning member which makes contact with the roll sponge 41 and self-cleans the roll sponge 41 with the rotation of the roll sponge 41. A cleaning-liquid supply nozzle 49 is attached to the mounting members 44. This cleaning-liquid supply nozzle 49 is located just above the cleaning plate 48. The cleaning-liquid supply nozzle 49 is comprised of a pipe member extending along the roll sponge 41 and having a large number of holes, formed at regular intervals, for supplying a cleaning liquid as a self-cleaning liquid to the roll sponge 41. The cleaning plate 48 and the cleaning-liquid supply nozzle 49 are slightly longer than the roll sponge 41, and extend along the roll sponge 41. The cleaning-liquid supply nozzle 49 may be shorter than the roll sponge 41 as long as the cleaning-liquid supply nozzle 49 can supply the cleaning liquid onto the entirety of the roll sponge 41.

The actuator 45 may be comprised of an air cylinder or an electric cylinder. The actuator 45 includes a rod 46 that can move between a forward position where the rod 46 presses the cleaning plate 48 forward to bring the cleaning plate 48 into contact with the roll sponge 41 and a backward position where the rod 46 is moved backward in a direction away from the cleaning plate 48 until the cleaning plate 48 is separated from the roll sponge 41. Thus, the actuator 45 serves as a moving mechanism for moving the cleaning plate 48, which is a self-cleaning member, between a position where the cleaning plate 48 is in contact with the roll sponge 41 and a position where the cleaning plate 48 is separated from the roll sponge 41. A hole is formed in the housing 43 so that when the rod 46 moves forward, a front end of the rod 46 will not hit against the housing 43. A cylindrical bellows, which may be made of a fluorocarbon polymer, may be provided around the hole so as to prevent a liquid, such as the cleaning liquid, from touching the rod 46 and to prevent the liquid from entering the housing 43. It is preferred that one end of the cylindrical bellows be secured to the housing 43 so as to surround the hole, while the other end of the bellows be secured to the front end of the rod 46. An air pipe (in the case of an air cylinder) or electrical wires (in the case of an electric cylinder) for actuating the actuator 45 is coupled to the actuator 45.

According to the cleaning module (i.e., the substrate cleaning apparatus) having the construction illustrated in FIGS. 10 and 11, when the actuator 45 is actuated to move the rod 46 forward, the rod 46 presses on the cleaning plate 48, thus bringing the cleaning plate 48 into contact with the roll sponge 41. The cleaning liquid (or the self-cleaning liquid) is supplied from the cleaning-liquid supply nozzle 49 to an area of contact between the roll sponge 41 and the cleaning plate 48. The cleaning plate 48, which is in contact with the roll sponge 41, thus self-cleans the roll sponge 41 with the rotation of the roll sponge 41 in the presence of the cleaning liquid between the roll sponge 41 and the cleaning plate 48.

When terminating the self-cleaning of the roll sponge 41, the rod 46 is moved backward by the actuator 45 until the rod 46 is detached from the cleaning plate 48. The mounting members 44 are each comprised of e.g. a leaf spring, and are therefore restorable. When the rod 46 moves backward and the pressing force of the rod 46 on the mounting members 44 becomes zero, the mounting members 44 return to original positions. When the mounting members 44 return to the original positions, the cleaning plate 48 separates from the roll sponge 41. As a result, the self-cleaning of the roll sponge 41 can be terminated. It is also possible to design the cleaning module such that the cleaning plate 48 is returned to an original position directly by the actuator 45.

Though not shown in FIGS. 10 and 11, a cleaning module for cleaning the back surface of the substrate W is provided at the back side of the substrate W. This cleaning module includes a roll sponge, a roll arm supporting the roll sponge, a self-cleaning member for self-cleaning the roll sponge, etc. having the same constructions as those of the cleaning module shown in FIGS. 10 and 11.

Figure 12:
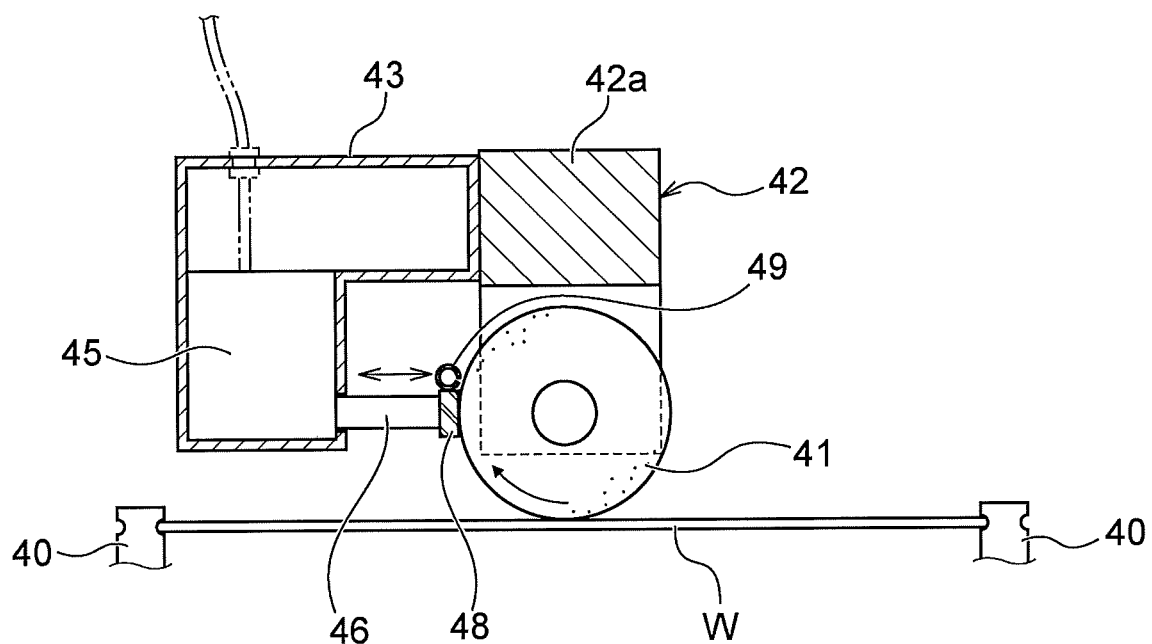
FIG. 12 is a diagram showing another embodiment of the cleaning module installed in the substrate processing apparatus shown in FIG. 1, and is a partial cross-sectional front view of the cleaning module.

FIG. 12 is a diagram showing another embodiment of the cleaning module installed in the substrate processing apparatus shown in FIG. 1. FIG. 12 is a partial cross-sectional front view of the cleaning module, and corresponds to FIG. 10.

In the cleaning module (substrate cleaning apparatus) shown in FIG. 12, the cleaning pate 48 and the cleaning-liquid supply nozzle 49 are mounted to the front end of the rod 46 of the actuator 45. The cleaning plate 48 and the cleaning-liquid supply nozzle 49 are slightly longer than the roll sponge 41, and extend along the roll sponge 41. The cleaning-liquid supply nozzle 49 is attached to the rod 46 such that the cleaning-liquid supply nozzle 49 lies on or above the cleaning plate 48. The constructions of the spindles 40, the roll sponge 41, the roll arm 42, the housing 43, etc. are the same as those of the cleaning module shown in FIGS. 10 and 11.

According to the cleaning module having the construction illustrated in FIG. 12, when the actuator 45 is actuated to move the rod 46 forward, the cleaning plate 48 is brought into contact with the roll sponge 41. At this time, the cleaning liquid (or the self-cleaning liquid) is supplied from the cleaning-liquid supply nozzle 49 to the area of contact between the roll sponge 41 and the cleaning plate 48. The cleaning plate 48, which is in contact with the roll sponge 41, thus self-cleans the roll sponge 41 with the rotation of the roll sponge 41 in the presence of the cleaning liquid between the roll sponge 41 and the cleaning plate 48. When terminating the self-cleaning of the roll sponge 41, the rod 46 is moved backward by the actuator 45 to thereby separate the cleaning plate 48 from the roll sponge 41. As a result, the self-cleaning of the roll sponge 41 can be terminated.

Figure 13:
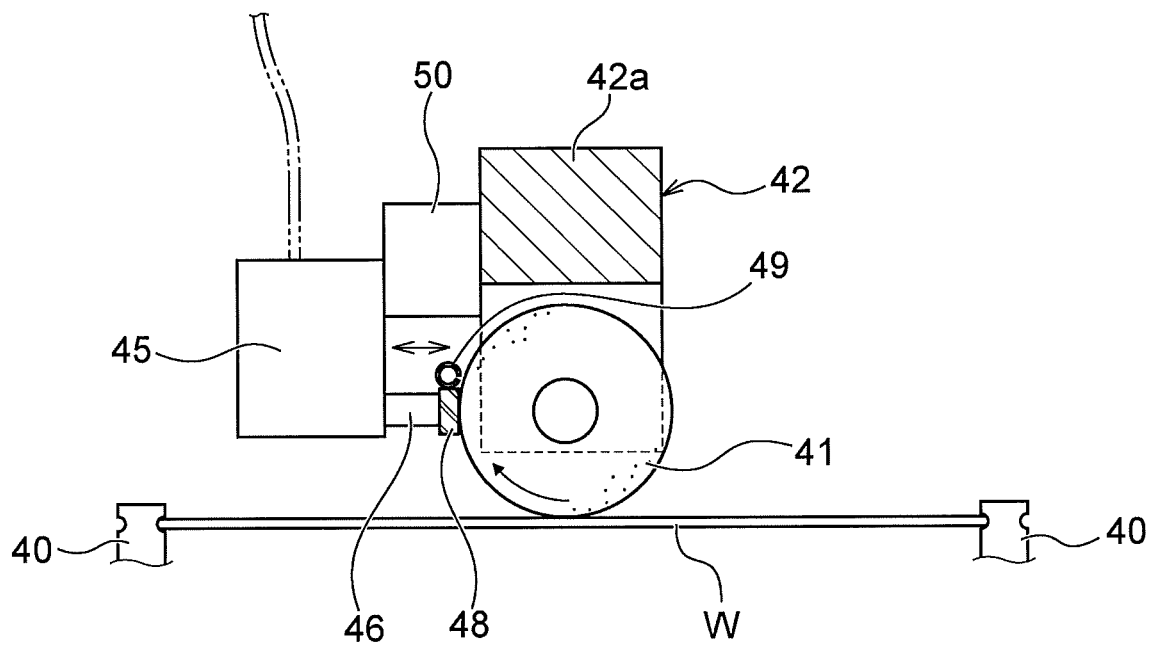
FIG. 13 is a diagram showing another embodiment of the cleaning module installed in the substrate processing apparatus shown in FIG. 1, and is a partial cross-sectional front view of the cleaning module.

FIG. 13 is a diagram showing another embodiment of the cleaning module installed in the substrate processing apparatus shown in FIG. 1. FIG. 13 is a partial cross-sectional front view of the cleaning module, and corresponds to FIG. 10.

In the cleaning module (substrate cleaning apparatus) shown in FIG. 13, the cleaning pate 48 and the cleaning-liquid supply nozzle 49 are mounted to the front end of the rod 46 of the actuator 45. Further, the actuator 45 is mounted via a mounting member 50 to the roll arm 42, so that the actuator 45 is coupled to (or integrated with) the roll arm 42. This embodiment, in which the roll arm 42 and the actuator 45 are integrated, enables a space-saving apparatus. The constructions of the spindles 40, the roll sponge 41, the roll arm 42, the cleaning plate 48, the cleaning-liquid supply nozzle 49, etc. are the same as those of the cleaning module shown in FIG. 12.

According to the cleaning module having the construction illustrated in FIG. 13, when the actuator 45 is actuated to move the rod 46 forward, the cleaning plate 48 is brought into contact with the roll sponge 41. At this time, the cleaning liquid (or the self-cleaning liquid) is supplied from the cleaning-liquid supply nozzle 49 to the area of contact between the roll sponge 41 and the cleaning plate 48. The cleaning plate 48, which is in contact with the roll sponge 41, thus self-cleans the roll sponge 41 with the rotation of the roll sponge 41 in the presence of the cleaning liquid between the roll sponge 41 and the cleaning plate 48. When terminating the self-cleaning of the roll sponge 41, the rod 46 is moved backward by the actuator 45 to thereby separate the cleaning plate 48 from the roll sponge 41. As a result, the self-cleaning of the roll sponge 41 can be terminated.

Figure 14:
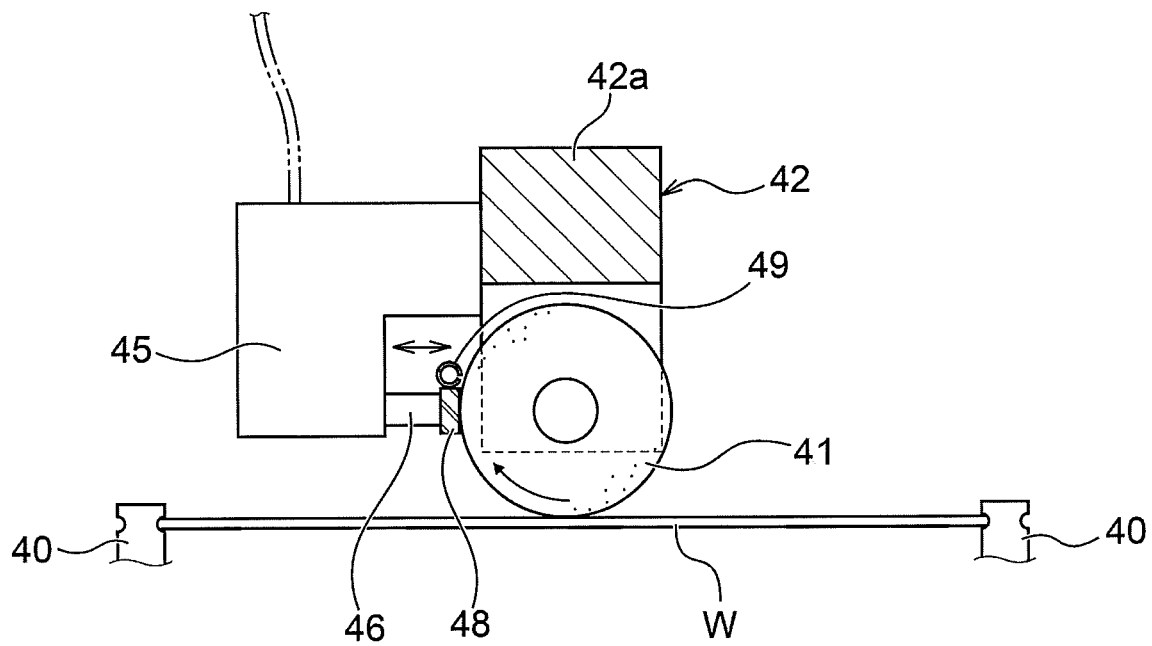
FIG. 14 is a diagram showing another embodiment of the cleaning module installed in the substrate processing apparatus shown in FIG. 1, and is a partial cross-sectional front view of the cleaning module.

FIG. 14 is a diagram showing another embodiment of the cleaning module installed in the substrate processing apparatus shown in FIG. 1. FIG. 14 is a partial cross-sectional front view of the cleaning module, and corresponds to FIG. 10.

In the cleaning module (substrate cleaning apparatus) shown in FIG. 14, the cleaning pate 48 and the cleaning-liquid supply nozzle 49 are mounted to the front end of the rod 46 of the actuator 45. Further, the actuator 45 is directly mounted on the roll arm 42, so that the actuator 45 is coupled to (or integrated with) the roll arm 42. This embodiment, in which the roll arm 42 and the actuator 45 are integrated, enables a space-saving apparatus. The constructions of the spindles 40, the roll sponge 41, the roll arm 42, the cleaning plate 48, the cleaning-liquid supply nozzle 49, etc. are the same as those of the cleaning module shown in FIG. 12.

According to the cleaning module having the construction illustrated in FIG. 14, when the actuator 45 is actuated to move the rod 46 forward, the cleaning plate 48 is brought into contact with the roll sponge 41. At this time, the cleaning liquid (or the self-cleaning liquid) is supplied from the cleaning-liquid supply nozzle 49 to the area of contact between the roll sponge 41 and the cleaning plate 48. The cleaning plate 48, which is in contact with the roll sponge 41, thus self-cleans the roll sponge 41 with the rotation of the roll sponge 41 in the presence of the cleaning liquid between the roll sponge 41 and the cleaning plate 48. When terminating the self-cleaning of the roll sponge 41, the rod 46 is moved backward by the actuator 45 to thereby separate the cleaning plate 48 from the roll sponge 41. As a result, the self-cleaning of the roll sponge 41 can be terminated.

A description will now be given of a substrate cleaning process and a self-cleaning process performed by the cleaning modules shown in FIGS. 10 to 14.

The spindles 40 first move away from each other. When a substrate W is suppled, the spindles 40 move forward until their top rollers hold the periphery of the substrate W. Thus, the substrate W is held in a horizontal position by the spindles 40 as shown in FIGS. 10 and 11. At that time the roll sponge 41 is in a standby position (which will be described later). One or more of the spindles 40, which is coupled to a motor, is rotated to apply a rotational force to the substrate W. While the substrate W is rotating, the roll arm 42 is moved so that the roll sponge 41 is moved from the standby position to the cleaning position. Specifically, as shown in FIGS. 10 and 11, the roll sponge 41, which is rotating, is brought into contact with the front surface (upper surface) of the substrate W. The actuator 45, the cleaning plate 48, and the cleaning-liquid supply nozzle 49, which are mounted to the roll arm 42, are moved together with the roll arm 42.

In this manner, while rotating the substrate W and supplying a cleaning liquid from a not-shown cleaning-liquid supply nozzle to the front surface (upper surface) of the substrate W, the rotating roll sponge 41 is placed in contact with the surface of the substrate W. The surface of the substrate W is thus scrub-cleaned with the roll sponge 41 in the presence of the cleaning liquid.

During the above-described cleaning process, the actuator 45, serving as a moving mechanism, is actuated to bring the cleaning plate 48 as a self-cleaning member into contact with the roll sponge 41 to carry out the self-cleaning of the roll sponge 41. The self-cleaning liquid may be supplied from the cleaning-liquid supply nozzle 49 to the area of contact between the roll sponge 41 and the cleaning plate 48. The self-cleaning can be started at any timing during a period from the start to the end of cleaning of the substrate W. Further, a self-cleaning time can be set arbitrarily during the period from the start to the end of cleaning of the substrate W.

After the completion of cleaning of the substrate W, the roll arm 42 is moved so that the roll sponge 41 is moved from the cleaning position to the standby position. The actuator 45, the cleaning plate 48, and the cleaning-liquid supply nozzle 49, which are mounted to the roll arm 42, move together with the roll arm 42.

The standby position of the roll sponge 41 lies lateral to or above the substrate W held by the spindles 40. In the case where the standby position lies lateral to the substrate W, the roll sponge 41 first moves upward from the cleaning position, and then moves horizontally until it reaches the standby position, where the roll sponge 41 is on standby. In the case where the standby positions lie above the substrate W, the roll sponge 41 moves upward from the cleaning position to the standby position, where the roll sponge 41 is on standby. In the case where the standby position lies lateral to the substrate W, the roll sponge 41 may first move upward from the cleaning position, then move horizontally, and subsequently move downward until it reaches the standby position, where the roll sponge 41 is on standby.

During the standby period, the actuator 45 as a moving mechanism is actuated to bring the cleaning plate 48 as a self-cleaning member into contact with the roll sponge 41 and, in addition, the self-cleaning liquid is supplied from the cleaning-liquid supply nozzle 49 to the area of contact between the roll sponge 41 and the cleaning plate 48, thereby carrying out the self-cleaning of the roll sponge 41. This self-cleaning can be started at any timing during the period from the start to the end of the standby of the roll sponge 41 in the standby position. Further, a self-cleaning time can be set arbitrarily during the period from the start to the end of the standby of the roll sponge 41.

The standby position of the roll sponge for cleaning of the back surface of the substrate W lies below the substrate W. Accordingly, the roll sponge simply moves up and down to reciprocate between the cleaning position and the standby position. Self-cleaning of the roll sponge in the cleaning position and in the standby position is performed in the same manner as the above-described self-cleaning of the roll sponge 41 for cleaning of the front surface of the substrate W.

In the embodiments shown in FIGS. 10 to 14, it is preferred that the length of the roll sponge 41 be slightly larger than the diameter of the substrate W, and that the length of the cleaning plate 48 be larger than the length of the roll sponge 41 in order not to leave uncleaned areas of the roll sponge 41. In the embodiments the length of the roll sponge 41 is set at 309 mm for a substrate having a diameter of 300 mm.

Though a roll sponge is used as a cleaning member for cleaning a substrate in the embodiments shown in FIGS. 10 to 14, it is possible to use a cleaning member other than a roll sponge. Further, the cleaning-liquid supply nozzle 49 for cleaning the roll sponge 41 may be omitted so that only a self-cleaning member, such as the cleaning plate 48, may be provided.

Though a linear moving mechanism is employed as the moving mechanism for moving the self-cleaning member in the embodiments shown in FIGS. 10 to 14, it is also possible to use a rotational moving mechanism, such as a rotary actuator, for rotationally moving the self-cleaning member.

The above-described embodiments have the following advantages.

(1) Self-cleaning of a cleaning member can be carried out, during cleaning of a substrate, by bringing a self-cleaning member into contact with the cleaning member. This operation prevents accumulation of dirt on the cleaning member. Since the cleaning member can be kept clean, highly-effective cleaning of a substrate, as well as a longer life of the cleaning member, can be expected.

(2) Self-cleaning of a cleaning member can be carried out at any arbitrary timing regardless of the position (cleaning position or standby position) and the state (during cleaning of a substrate or during standby) of the cleaning member. Thus, the timing of cleaning of the cleaning member and the cleaning time can be set arbitrarily during processing of a substrate. Further, it becomes possible to achieve a high self-cleaning effect while reducing wear of the cleaning member. A longer life of the cleaning member can therefore be expected.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate cleaning apparatus comprising:
   a substrate holding mechanism configured to hold and rotate a substrate;
   a cleaning-liquid supply nozzle configured to supply a cleaning liquid onto the substrate held by the substrate holding mechanism;
   a roll cleaning tool configured to clean the substrate by rubbing the substrate in the presence of the cleaning liquid; and
   a suction system coupled to the roll cleaning tool and configured to suck the cleaning liquid from the substrate through the roll cleaning tool while the roll cleaning tool is cleaning the substrate,
   wherein the suctions system includes:
      a cleaning liquid suction pipe coupled to the roll cleaning tool; and
      a vacuum line coupled to the cleaning liquid suction pipe.

2. The substrate cleaning apparatus according to claim 1, wherein the suction system further includes:
   a suction valve attached to the cleaning liquid suction pipe.

3. The substrate cleaning apparatus according to claim 2, further comprising a controller configured to control operation of the suction valve, the controller being configured to keep the suction valve open during cleaning of the substrate with the roll cleaning tool.

4. The substrate cleaning apparatus according to claim 1, wherein:
   the roll cleaning tool includes a shaft and a sponge member that covers a peripheral surface of the shaft;
   the shaft has a main flow passage extending in the shaft, a plurality of openings formed in the peripheral surface of the shaft, and a plurality of branch flow passages providing fluid communication between the main flow passage and the plurality of openings; and
   the cleaning liquid suction pipe is coupled to the main flow passage.

5. The substrate cleaning apparatus according to claim 2, further comprising an inner rinsing liquid supply line coupled to the cleaning liquid suction pipe, a connection point between the cleaning liquid suction pipe and the inner rinsing liquid supply line being located between the suction valve and the roll cleaning tool.

6. A substrate cleaning method comprising:
   supplying a cleaning liquid onto a substrate from a cleaning-liquid supply nozzle and rubbing a roll cleaning tool against the substrate in the presence of the cleaning liquid to clean the substrate, and
   sucking the cleaning liquid from the substrate through the roll cleaning tool while the roll cleaning tool is cleaning the substrate, by use of a suction system coupled to the roll cleaning tool.

7. A substrate processing apparatus comprising:
   a polishing unit configured to polish a substrate; and
   a substrate cleaning apparatus configured to clean the substrate that has been polished by the polishing unit,
   wherein the substrate cleaning apparatus includes:
   a substrate holding mechanism configured to hold and rotate the substrate;
   a cleaning-liquid supply nozzle configured to supply a cleaning liquid onto the substrate held by the substrate holding mechanism;
   a roll cleaning tool configured to clean the substrate by rubbing the substrate in the presence of the cleaning liquid; and
   a suction system coupled to the roll cleaning tool and configured to suck the cleaning liquid from the substrate through the roll cleaning tool while the roll cleaning tool is cleaning the substrate, by use of a suction system coupled to the roll cleaning tool, and
   wherein the suctions system includes:
   a cleaning liquid suction pipe coupled to the roll cleaning tool; and
   a vacuum line coupled to the cleaning liquid suction pipe.

8. The substrate processing apparatus according to claim 7, wherein the suction system further includes a suction valve attached to the cleaning liquid suction pipe.

9. The substrate processing apparatus according to claim 1, wherein the suction system further includes a gas-liquid separation tank attached to the vacuum line.

10. The substrate processing apparatus according to claim 7, wherein the suction system further includes a gas-liquid separation tank attached to the vacuum line.

* * * * *